United States Patent
Lee et al.

(10) Patent No.: US 12,080,797 B2
(45) Date of Patent: Sep. 3, 2024

(54) MULTI-BRIDGE CHANNEL FIELD EFFECT TRANSISTOR WITH RECESSED SOURCE/DRAIN

(71) Applicant: SAMSUNG ELECTRONICS CO., LTD., Suwon-si (KR)

(72) Inventors: Dohyun Lee, Seoul (KR); Dongwoo Kim, Suwon-si (KR); Daeyong Kim, Yongin-si (KR); Rakhwan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 416 days.

(21) Appl. No.: 17/467,656

(22) Filed: Sep. 7, 2021

(65) Prior Publication Data

US 2022/0216339 A1 Jul. 7, 2022

(30) Foreign Application Priority Data

Jan. 4, 2021 (KR) .................. 10-2021-0000277

(51) Int. Cl.
| | |
|---|---|
| *H01L 29/78* | (2006.01) |
| *H01L 29/08* | (2006.01) |
| *H01L 29/10* | (2006.01) |
| *H01L 29/417* | (2006.01) |
| *H01L 29/66* | (2006.01) |

(52) U.S. Cl.
CPC ...... *H01L 29/7851* (2013.01); *H01L 29/0847* (2013.01); *H01L 29/1033* (2013.01); *H01L 29/41791* (2013.01); *H01L 29/66553* (2013.01)

(58) Field of Classification Search
CPC ......... H01L 29/42392; H01L 29/78696; H01L 29/7851; H01L 29/0847; H01L 29/1033; H01L 29/41791; H01L 29/66553; H01L 23/485; H01L 21/76805; H01L 29/7848; H01L 21/823475
See application file for complete search history.

(56) References Cited

U.S. PATENT DOCUMENTS

| | | | |
|---|---|---|---|
| 8,772,155 B2 | 7/2014 | Haimson et al. | |
| 8,791,510 B2 | 7/2014 | Lee | |
| 8,927,378 B2 | 1/2015 | Pei et al. | |
| 9,735,050 B2 | 8/2017 | Lin et al. | |
| 9,972,692 B2 | 5/2018 | Choi et al. | |

(Continued)

*Primary Examiner* — Changhyun Yi
(74) *Attorney, Agent, or Firm* — F. CHAU & ASSOCIATES, LLC

(57) ABSTRACT

The present disclosure provides a semiconductor device. The semiconductor device includes an active region, a plurality of channel layers, gate electrodes, a source/drain region, and a contact structure. The active region is disposed on a substrate and extends in a first direction. The plurality of channel layers are disposed on the active region to be spaced apart from each other vertically. The gate electrodes are disposed on the substrate, intersecting the active region and the plurality of channel layers, extending in a third direction, and surrounding the plurality of channel layers. The source/drain region is disposed on the active region on at least one side of the gate electrodes, and contacting the plurality of channel layers. The contact structure is disposed between the gate electrodes, extending in the second direction, and contacting the source/drain region.

20 Claims, 18 Drawing Sheets

(56) References Cited

U.S. PATENT DOCUMENTS

| | | |
|---|---|---|
| 10,079,210 B2 | 9/2018 | Lee et al. |
| 10,084,063 B2 | 9/2018 | Kuang et al. |
| 10,103,028 B2 | 10/2018 | Bauer |
| 10,199,230 B2 | 2/2019 | Ganguli et al. |
| 10,269,714 B2 | 4/2019 | Bruley et al. |
| 10,304,938 B2 | 5/2019 | Adusumilli et al. |
| 10,535,748 B2 | 1/2020 | Cheng et al. |
| 10,714,579 B2 | 7/2020 | Lee et al. |
| 2004/0127027 A1 | 7/2004 | Lee et al. |
| 2016/0005824 A1 | 1/2016 | Lin et al. |
| 2017/0110554 A1* | 4/2017 | Tak .................. H01L 29/42392 |
| 2019/0348498 A1* | 11/2019 | Cheng ............... H01L 29/42392 |
| 2022/0052157 A1* | 2/2022 | Chang ............... H01L 29/41766 |

* cited by examiner

MULTI-BRIDGE CHANNEL FIELD EFFECT TRANSISTOR WITH RECESSED SOURCE/DRAIN

CROSS-REFERENCE TO RELATED APPLICATION(S)

This application claims benefit of priority under 35 U.S.C. § 119 to Korean Patent Application No. 10-2021-0000277 filed on Jan. 4, 2021 in the Korean Intellectual Property Office, the disclosure of which is incorporated by reference herein in its entirety.

BACKGROUND

The present inventive concept relates to a semiconductor device.

A semiconductor is a material with conductivity between a conductor and an insulator. Semiconductor materials are used in semiconductor devices and are used to create integrated circuits in an electronic device. Semiconductors are used in televisions, computers, tablets, and mobile phones to name a few applications.

Integration may refer to a semiconductor device with a fine pattern or structure. As demand for high performance, high speed, and/or multifunctionality in a semiconductor device increases, a higher degree of integration of the semiconductor device is increasing, where a fine width or a fine separation distance is used. Additionally, a semiconductor device may include a fin field-effect transistor (FinFET) system, with a three-dimensional electrical channel. The FinFET system is used to overcome the limitations of operating characteristics due to a reduction in size of a planar metal oxide semiconductor FET (MOSFET).

As design constraints for semiconductors continue to become smaller, an electrical contact point (trench) also reduces in size. Therefore, filling the contact point with a semiconductor layer becomes difficult. As a result, there is a need in the art for an improved process for the application of semiconductor material to a contact point.

SUMMARY

An aspect of the present inventive concept is to provide a semiconductor device with improved electrical characteristics.

According to an aspect of the present inventive concept, a semiconductor device includes an active region disposed on a substrate, the active region extending in a first direction; a plurality of channel layers disposed on the active region, the plurality of channel layers spaced apart from each other along a second direction; gate electrodes disposed on the substrate, the gate electrodes intersecting the active region and the plurality of channel layers, extending in a third direction, and surrounding the plurality of channel layers; a source/drain region disposed on the active region on at least one side of the gate electrodes, the source/drain region contacting the plurality of channel layers; and a contact structure disposed between the gate electrodes, the contact structure extending in the second direction and contacting the source/drain regions, wherein the source/drain region includes a recess region recessed from an upper portion of the source/drain region, wherein the contact structure includes a metal-semiconductor layer disposed to fill the recess region and a contact plug disposed on the metal-semiconductor layer, wherein a lower surface of the metal-semiconductor layer is located at a level lower than an uppermost channel layer among the plurality of channel layers.

According to an aspect of the present inventive concept, a semiconductor device includes an active region disposed on a substrate, the active region extending in a first direction; first to third channel layers disposed on the active region, the plurality of channel layers spaced apart from each other along a second direction; a gate electrode, the gate electrode disposed between the active region and the first channel layer, disposed between the first to third channel layers, disposed on the third channel layer, and extending in a third direction; a source/drain region disposed on the active region on at least one side of the gate electrode, the source/drain region contacting the first to third channel layers and including a recess region; and a contact structure including a metal-semiconductor layer and a contact plug, the metal-semiconductor layer filling the recess region of the source/drain region and the contact plug disposed on the metal-semiconductor layer, wherein a lower end of the recess region is located at a level lower than the third channel layer, and a thickness of the metal-semiconductor layer in the second direction is greater than a thickness of the third channel layer in the second direction.

According to an aspect of the present inventive concept, a semiconductor device includes an active region disposed on a substrate, the active region extending in a first direction; a plurality of channel layers disposed on the active region, the plurality of channel layers spaced apart from each other along a second direction; a gate electrode disposed on the substrate, the gate electrode intersecting the active region and the plurality of channel layers, extending in a third direction, and surrounding the plurality of channel layers; a source/drain region disposed on the active region on at least one side of the gate electrode, the source/drain region including a recess region recessed from an upper portion of the source/drain region; an interlayer insulating layer covering a portion of an upper surface of the source/drain region on at least one side of the gate electrode; a metal-semiconductor layer disposed to fill the recess region of the source/drain region; and a contact plug passing through the interlayer insulating layer and contacting an upper surface of the metal-semiconductor layer, wherein the upper surface of the metal-semiconductor layer is disposed at a level equal to or higher than an upper surface of an uppermost channel layer among the plurality of channel layers.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
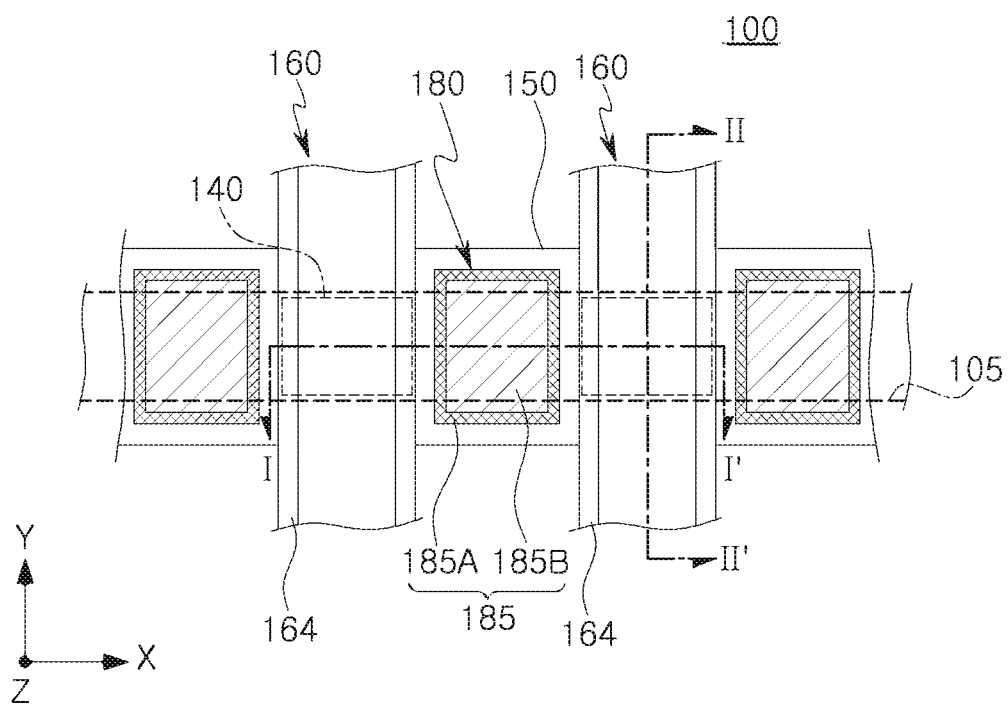
FIG. 1 is a plan view illustrating a semiconductor device according to example embodiments.

The present disclosure relates generally to a semiconductor device. More particularly, embodiments of the present disclosure relate to a semiconductor device with improved electrical characteristics.

A semiconductor is a material with conductivity between a conductor and an insulator. Semiconductor materials are used in semiconductor devices and are used to create integrated circuits in an electronic device. Semiconductors are used in televisions, computers, tablets, and mobile phones, etc. As the demand for smaller and more efficient semiconductors increases, a size of an electrical contact point (trench) may also reduce in size. Therefore, filling the contact point with a semiconductor layer becomes difficult. For example, the formation of a logic-contact structure may include forming metal silicide at the bottom of a semiconductor feature, which may become difficult as the size of semiconductors are reduced. As a result, there is a need in the art for an improved process for the application of semiconductor material to a contact point.

According to techniques described herein, a metal-semiconductor compound (e.g., such as titanium silicide (TiSi)) may be used to form a metal-semiconductor layer to fill a recess in the semiconductor. In some examples, the metal-semiconductor layer may reduce a ratio occupied by a barrier layer with high resistance in a contact structure (e.g., to lower contact resistance). Additionally, or alternatively, the metal-semiconductor layer may be formed to be thick only in the recess region. Therefore, the semiconductor device of the present disclosure may have improved electrical characteristics.

Embodiments of the present disclosure include semiconductor devices with an active region, a plurality of channel layers, gate electrodes, a source/drain region, and a contact structure. The active region is disposed on a substrate and extends in a first direction (e.g., a horizontal direction). The plurality of channel layers are disposed on the active region to be spaced apart from each other in a second direction (e.g., a vertical direction, such that the channel layers are spaced apart vertically). The gate electrodes are disposed on the substrate, intersecting the active region and the plurality of channel layers, extending in a third direction (e.g., a second horizontal direction perpendicular to the first and second directions), and surrounding the plurality of channel layers. The source/drain region is disposed on the active region on at least one side of the gate electrodes, and contacting the plurality of channel layers. The contact structure is disposed between the gate electrodes, extending in the second direction, and contacting the source/drain regions.

The source/drain region includes a recess region recessed from an upper portion of the source/drain region. Additionally, or alternatively, the contact structure includes a metal-semiconductor layer disposed to fill the recess region and a contact plug disposed on the metal-semiconductor layer. Also, a lower surface of the metal-semiconductor layer is located at a level lower than an uppermost channel layer among the plurality of channel layers.

Hereinafter, example embodiments of the present inventive concept will be described with reference to the accompanying drawings.

FIG. 1 is a plan view illustrating a semiconductor device according to example embodiments.

Figure 2:
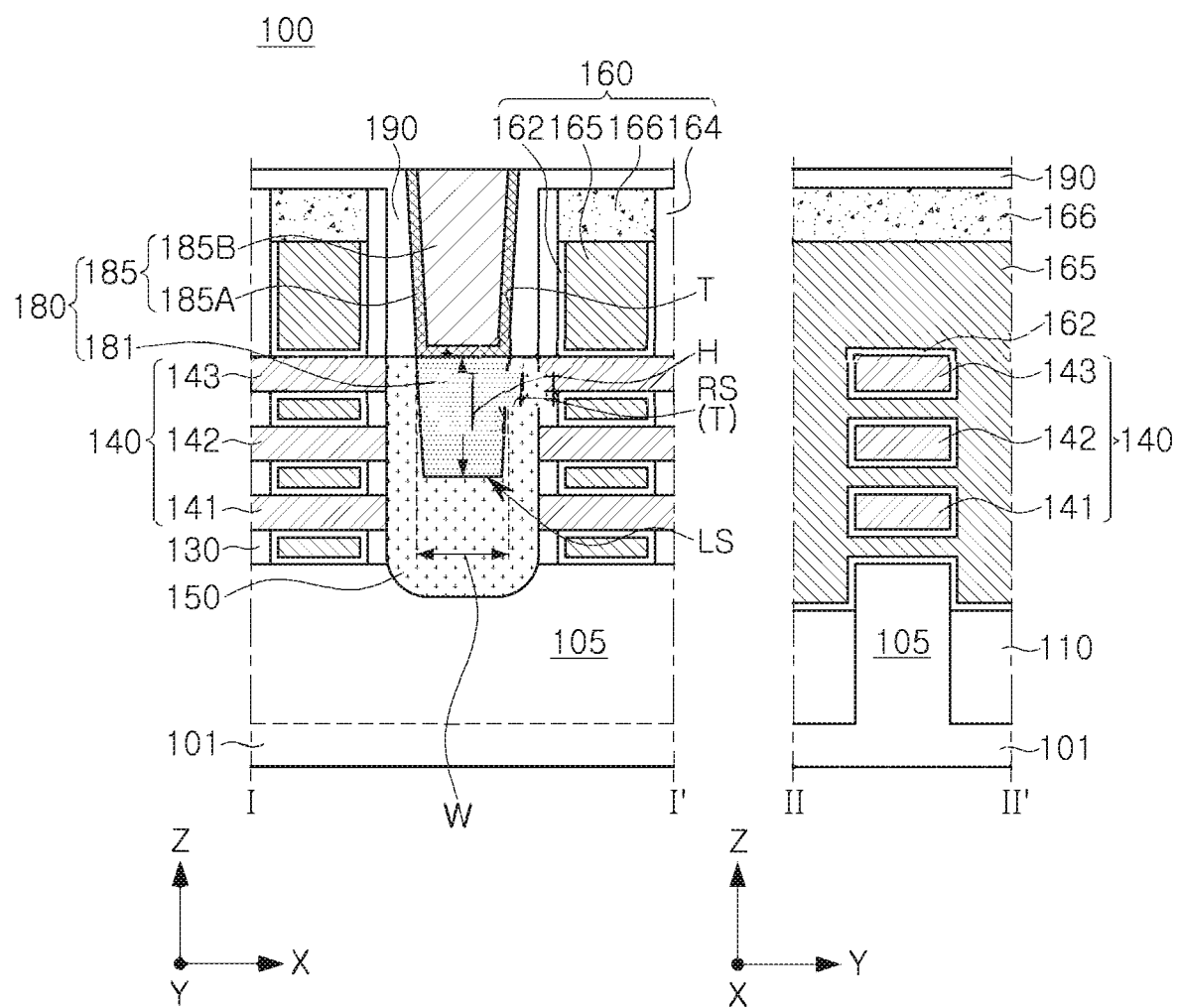
FIG. 2 is a cross-sectional view illustrating a semiconductor device according to example embodiments.

FIG. 2 is a cross-sectional view illustrating a semiconductor device according to example embodiments. FIG. 2 is a cross-sectional view of the semiconductor device of FIG. 1, taken along lines I-I' and II-II'. For the convenience of description, major components of a semiconductor device are illustrated in FIGS. 1 and 2.

Referring to FIGS. 1 and 2, a semiconductor device 100 may include a substrate 101, an active region 105 disposed on the substrate 101, a channel structure 140 including a plurality of channel layers 141, 142, and 143 disposed on the active region 105 to be spaced apart from each other in a second direction (e.g., spaced apart vertically), source/drain regions 150 contacting the plurality of channel layers 141, 142, and 143, gate structures 160 intersecting the active region 105 and extending, and contact structures 180 connected to the source/drain regions 150. The semiconductor device 100 may further include internal spacer layers 130, device isolation layers 110, and interlayer insulating layers 190.

In the semiconductor device 100, the active region 105 may have a fin structure, and a gate electrode 165 of the gate structure 160 may be disposed between the active region 105 and the channel structure 140, between the plurality of channel layers 141, 142, and 143 of the channel structure 140, and above the channel structure 140. Therefore, the semiconductor device 100 may include a multi-bridge channel FET (MBCFET™) formed by the channel structure 140, the source/drain regions 150, and the gate electrode 165.

The present inventive concept is not limited thereto, and, may be, for example, a FinFET, a transistor in which the active region 105 may have a fin structure and a channel region of the transistor may be formed in the active region 105 intersecting the gate electrode 165. The present inventive concept may be, for example, a vertical field-effect transistor (Vertical FET) in which an active region 105 extending in a direction, perpendicular to an upper surface of a substrate 101, and a gate structure 160 surrounding a side surface of the active region 105 are arranged.

The substrate 101 may have an upper surface extending in X and Y-directions. The substrate 101 may include a semiconductor material, such as a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, an epitaxial layer, a silicon-on-insulator (SOI) layer, a semiconductor-on-insulator (SeOI) layer, or the like.

In some examples described herein, a first direction may include or refer to the X-direction, a second direction may include or refer to the Z-direction, and a third direction may include or refer to the Y-direction. In some cases, the X-direction and the Y-direction may be referred to as horizontal directions (e.g., the X-direction and the Y-direction may define a horizontal plane) and the Z-direction may be referred to as a vertical direction. In some cases, a vertical direction may refer to a direction perpendicular to a surface of the substrate 101 (e.g., where a surface of the substrate 101 may be parallel to a horizontal plane).

The active region 105 may be defined by the device isolation layer 110 in the substrate 101, and may be disposed to extend in a first direction, for example, the X-direction. The active region 105 may have a structure protruding from the substrate 101. An upper end of the active region 105 may be disposed to protrude from an upper surface of the device isolation layer 110 to a predetermined height. The active region 105 may be formed as a portion of the substrate 101 or may include an epitaxial layer grown from the substrate 101. On both sides of the gate structure 160, the active region 105 on the substrate 101 may be fully or partially recessed, and the source/drain regions 150 may be disposed on the recessed active region 105. Therefore, as illustrated in FIG. 2, the active region 105 below the channel structure 140 and the gate structure 160 may have a relatively high height. According to embodiments, the active region 105 may include impurities, and at least some of the active regions 105 may include impurities of different conductivity types, but is not limited thereto. The active regions 105 may be spaced apart from each other in the Y-direction and may be disposed in plural.

The device isolation layer 110 may define the active region 105 in the substrate 101. The device isolation layer 110 may be formed by, for example, a shallow trench isolation (STI) process. The device isolation layer 110 may expose upper sidewalls of the active region 105. According to embodiments, the device isolation layer 110 may include a region extending deeper in a lower portion of the substrate 101 between the active regions 105. The device isolation layer 110 may have an upper surface with a curved shape and a higher level closer to the active region 105, but a shape of the upper surface of the device isolation layer 110 is not limited thereto. The device isolation layer 110 may be formed of insulating material. The device isolation layer 110 may be, for example, an oxide, a nitride, or a combination thereof.

The channel structure 140 may include the plurality of channel layers 141, 142, and 143, which may be two or more channel layers disposed on the active region 105 to be spaced apart from each other in a direction, perpendicular to an upper surface of the active region 105, for example, in a Z direction. The first to third channel layers 141, 142, and 143 may be connected to the source/drain regions 150, and may be spaced apart from the upper surface of the active region 105. Each of the first to third channel layers 141, 142, and 143 may have a width, equal or similar to a width of the active region 105 in the Y-direction, and may have a width, equal or similar to a width of the gate structure 160 in the X-direction. According to embodiments, each of the first to third channel layers 141, 142, and 143 may have a reduced width to locate side surfaces thereof below the gate structure 160 in the X-direction. The first to third channel layers 141, 142, and 143 may be formed of semiconductor material, and may include, for example, at least one of silicon (Si), silicon germanium (SiGe), or germanium (Ge). The first to third channel layers 141, 142, and 143 may be formed of the same material as the substrate 101, for example. The number and shapes of the channel layers 141, 142, and 143 constituting one channel structure 140 may be variously changed in embodiments.

The source/drain regions 150 may be disposed on the active region 105 on both sides of the channel structure 140. The source/drain regions 150 may be provided as a source region or a drain region of a transistor. The source/drain regions 150 may be arranged to cover the side surfaces of the first to third channel layers 141, 142, and 143 of the channel structure 140 and the upper surface of the active region 105 on lower ends of the source/drain regions 150. The source/drain regions 150 may be disposed to partially recess the upper portion of the active region 105, but, in embodiments, whether a recess is present or not and a depth of the recess may be variously changed. The source/drain regions 150 may be a semiconductor layer including silicon (Si), and may be formed as epitaxial layers. The source/drain regions 150 may include impurities of different types and/or concentrations. For example, the source/drain regions 150 may include n-type doped silicon (Si) and/or p-type doped silicon germanium (SiGe). In example embodiments, the source/drain regions 150 may include a plurality of regions including elements and/or doping elements, with different concentrations. In an example embodiment, the source/drain region 150 may have a merged shape connected to each other between the active regions 105 adjacent to each other in the Y-direction, but is not limited thereto.

The source/drain region 150 may include a recess region RS for connection with the contact structure 180. The recess region RS may be a region in which a portion of a contact trench T in which the contact structure 180 is disposed extends into the source/drain region 150, to be recessed from an upper portion of the source/drain region 150. A lower surface or a bottom surface of the recess region RS may be located at a level lower than a third channel layer 143, which may be an uppermost channel layer.

In an example embodiment, a depth H of the recess region RS may be, for example, between approximately 10 nm and 40 nm (e.g., a depth H of the recess region RS may be about 10 nm or more and about 40 nm or less). In an example embodiment, a depth H of the recess region RS may be between approximately 10 nm and 30 nm (e.g., a depth H of the recess region RS may be about 10 nm or more and about 30 nm or less). In some examples, a depth H of the recess is 10 nm or more and a thickness of the metal silicide to fill the recess is also 10 nm or more.

When the depth H of the recess region RS is less than 10 nm, a length of an electrical connection path between the contact structure 180 and the channel structure 140 may increase, to have a relatively low resistance reduction effect. A maximum value of the depth of the recess region RS may be determined, depending on a thickness of the source/drain region 150, and may be, for example, determined within a range not passing through the source/drain region 150. The source/drain region 150 may have a thickness in a second direction (e.g., a vertical thickness) greater than about 10 nm, greater than about 30 nm, or greater than about 40 nm, but is not limited thereto. The depth H of the recess region RS may be a distance along a second direction (e.g., a vertical distance) from an upper surface level of the source/drain region 150 or an upper surface level of the third channel layer 143 to the bottom surface of the recess region RS. In an example embodiment, the depth H of the recess region RS may be greater than a thickness in a second direction (e.g., a vertical thickness) of any one of the plurality of channel layers 141, 142, and 143. In an example embodiment, a width W of an upper portion of the recess region RS may be, for example, in a range of about 5 nm to about 15 nm or about 10 nm to about 15 nm.

The gate structure 160 may be disposed on or above the active region 105 and the channel structures 140 to intersect the active region 105 and the channel structures 140, to extend in one direction, for example, in the Y-direction. Channel regions of transistors may be formed in the active region 105 and the channel structures 140, intersecting the gate structure 160. The gate structure 160 may include a gate electrode 165, a gate dielectric layer 162 between the gate electrode 165 and the plurality of channel layers 141, 142, and 143, spacer layers 164 on side surfaces of the gate electrode 165, and a gate capping layer 166 on an upper surface of the gate electrode 165.

The gate dielectric layer 162 may be disposed between the active region 105 and the gate electrode 165 and between the channel structure 140 and the gate electrode 165, and may be disposed to cover at least some of the surfaces of the gate electrode 165. For example, the gate dielectric layer 162 may be disposed to entirely surround surfaces of the gate electrode 165, except for an uppermost surface of the gate electrode 165. The gate dielectric layer 162 may extend between the gate electrode 165 and the spacer layers 164, but is not limited thereto. The gate dielectric layer 162 may include oxide, nitride, or a high-k material. The high-k material may mean a dielectric material with a dielectric constant, higher than a dielectric constant of a silicon oxide film ($SiO_2$). The high-k material may be at least one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrode 165 may be disposed on the active region 105 to fill between the plurality of channel layers 141, 142, and 143, and may extend over the channel structure 140. The gate electrode 165 may be spaced apart from the plurality of channel layers 141, 142, and 143 by the gate dielectric layer 162. The gate electrode 165 may include a conductive material, and may include, for example, a metal nitride such as titanium nitride (TiN), tantalum nitride (TaN), or tungsten nitride (WN), and/or a metal material such as aluminum (Al), tungsten (W), molybdenum (Mo), or the like, or a semiconductor material such as doped polysilicon. In some embodiments, the gate electrode 165 may be formed as two or more multiple layers.

The spacer layers 164 may be disposed on both the side surfaces of the gate electrode 165, and may extend in the Z direction, perpendicular to the upper surface of the substrate 101. In an example embodiment, the spacer layers 164 may include a portion in which an outer side surface thereof has a curved shape such that a width of an upper portion of each of the spacer layers 164 is narrower than a width of a lower portion of each of the spacer layers 164. The spacer layers 164 may insulate the source/drain regions 150 and the gate electrodes 165. The spacer layers 164 may have a multilayer structure according to embodiments. The spacer layers 164 may be formed of oxide, nitride, or oxynitride, and in particular, may be formed of a low-k film.

The gate capping layer 166 may be disposed on the gate electrode 165. The gate capping layer 166 may be disposed to extend along an upper surface of the gate electrode 165 in a third direction, for example, in the Y-direction. Side surfaces of the gate capping layer 166 may be surrounded by spacer layers 164. An upper surface of the gate capping layer 166 may be substantially coplanar with an upper surface of the spacer layers 164, but is not limited thereto. The gate capping layer 166 may be formed of oxide, nitride, or oxynitride, and may include at least one of SiO, SiN, SiCN, SiOC, SiON, or SiOCN.

The internal spacer layers 130 may be disposed on the sides of the gate electrode 165 between the channel structures 140. The internal spacer layers 130 may be disposed side by side with the gate electrode 165. The internal spacer layers 130 may be disposed on both sides of the gate structure 160 in the first direction, for example, the X-direction, on the lower surfaces of each of the first to third channel layers 141, 142, and 143. The internal spacer layers 130 may have outer side surfaces substantially coplanar with outer side surfaces of the first to third channel layers 141, 142, and 143. Under the third channel layer 143, the gate electrode 165 may be separated from the source/drain regions 150 by the internal spacer layers 130, and may be electrically separated. The internal spacer layers 130 may have a shape in which a side surface facing the gate electrode 165 is convexly rounded toward the gate electrode 165 in an inward direction, but is not limited thereto. The internal spacer layers 130 may be formed of oxide, nitride, or oxynitride, and in particular, may be formed of a low-k film. According to embodiments, the internal spacer layers 130 may be omitted.

The contact structure 180 may pass through the interlayer insulating layer 190 between the gate structures 160 in the second direction, for example, in the vertical Z direction. The contact structure 180 may be connected to the source/drain regions 150. The contact structure 180 may apply an electrical signal to the source/drain regions 150. The contact structure 180 may be disposed on the source/drain regions 150, and according to embodiments, may be disposed to have a length, longer than a length of the source/drain regions 150 in the Y-direction. The contact structure 180 may have an inclined side surface in which a width of a lower portion becomes narrower than a width of an upper portion, depending on an aspect ratio, but is not limited thereto. The contact structure 180 may include a metal-semiconductor layer 181 disposed in the recess region RS of the source/drain region 150, and a contact plug 185 on the metal-semiconductor layer 181.

The metal-semiconductor layer 181 may be disposed to fill the recess region RS of the source/drain region 150. Therefore, the contact plug 185 may not extend into the recess region RS, and may have a lower surface at a level higher than the third channel layer 143 that may be an uppermost channel layer. For example, since the metal-semiconductor layer 181 is flat in the recess region RS (e.g., since the metal-semiconductor layer 181 does not have a bent portion in the recess region RS) and since the metal-semiconductor layer 181 fills the recess region RS, a proportion occupied by a barrier layer 185A with relatively high resistance in the contact structure 180 may be reduced to decrease contact resistance. Therefore, a semiconductor device with improved electrical characteristics may be provided. The metal-semiconductor layer 181 may overlap at least two of the channel layers 141, 142, and 143 in a horizontal direction.

A lower surface LS of the metal-semiconductor layer 181 may be in contact with the bottom surface of the recess region RS, and may be located at a level lower than the third channel layer 143 and the second channel layer 142. The lower surface LS of the metal-semiconductor layer 181 may be disposed at a predetermined depth H from an upper surface of the source/drain region 150 or an upper surface of the metal-semiconductor layer 181, and a level of the lower surface LS may be changed according to embodiments. As a thickness H of the metal-semiconductor layer 181 in the Z direction increases, since a length of an electrical connection path between the contact structure 180 and the channel structure 140 may decrease to lower resistance, electrical characteristics of the semiconductor device may be improved.

The metal-semiconductor layer 181 may have, for example, a shape with a vertical thickness H (e.g., Z-direction thickness H) greater than a horizontal width W (e.g., X-direction width W) but is not limited thereto. For example, a ratio of the vertical thickness H to the horizontal width W of the metal-semiconductor layer 181 may be about 0.7 or more and about 4 or less. For example, the ratio of the vertical thickness H to the horizontal width W of the metal-semiconductor layer 181 may be about 0.8 or more and about 3 or less. In this case, the horizontal width W of the metal-semiconductor layer 181 may be a width of the upper surface of the metal-semiconductor layer 181 in the X-direction and may be a maximum width of the metal-semiconductor layer 181 in the X-direction. In an example embodiment, the horizontal width W of the metal-semiconductor layer 181 may be equal to or less than a width of the lower surface of the contact plug 185. The horizontal width W and the vertical thickness H of the metal-semiconductor layer 181 may correspond to the horizontal width W of the upper portion of the recess region RS and the vertical depth H of the recess region RS, respectively.

The metal-semiconductor layer 181 may include, for example, metal silicide, metal germanide, or metal silicide-germanide. In the metal-semiconductor layer 181, the metal may be titanium (Ti), nickel (Ni), tantalum (Ta), cobalt (Co), or tungsten (W), and the semiconductor may be silicon (Si), germanium (Ge), or silicon germanium (SiGe). For example, the metal-semiconductor layer 181 may include at least one of cobalt silicide (CoSi), titanium silicide (TiSi), nickel silicide (NiSi), or tungsten silicide (WSi).

The contact plug 185 may be disposed in the contact trench T passing through the interlayer insulating layer 190, and may be disposed on the source/drain region 150 to contact the upper surface of the metal-semiconductor layer 181. The lower surface of the contact plug 185 may be located at a level higher than the third channel layer 143, but is not limited thereto, and may be located at a level, equal to or lower than an upper surface of the third channel layer 143 or at a lower level. The contact plug 185 may not overlap the plurality of channel layers 141, 142, and 143 in a horizontal direction. The contact plug 185 may not overlap the source/drain regions 150 in a horizontal direction. The contact plug 185 may include a barrier layer 185A and a conductive layer 185B. The barrier layer 185A may surround a lower surface and side surfaces of the conductive layer 185B. The barrier layer 185A may include at least one of a metal nitride, for example, titanium nitride (TiN), tantalum nitride (TaN), or tungsten nitride (WN). The conductive layer 185B may include at least one of a metallic material, for example, aluminum (Al), copper (Cu), tungsten (W), cobalt (Co), ruthenium (Ru), or molybdenum (Mo).

The interlayer insulating layer 190 may be disposed to cover upper surfaces of the source/drain regions 150 and upper surfaces of the gate structures 160. The interlayer insulating layer 190 may be disposed to cover an upper surface of a region of the device isolation layers 110, not covered by the gate structure 160. The interlayer insulating layer 190 may include, for example, at least one of oxide, nitride, or oxynitride, and may include a low-k material.

Next, referring to FIG. 2, the barrier layer 185A and the conductive layer 185B may be formed in the contact trench T. The barrier layer 185A may be formed to cover an inner wall of the contact trench T and an upper surface of the metal-semiconductor layer 181. The conductive layer 185B may be formed to fill a space between inner walls of the barrier layer 185A in the contact trench T using, for example, PVD or CVD. Depending on an embodiment, a contact plug 185 from which the barrier layer 185A is omitted may be formed. Thereafter, circuit wirings electrically connected to the gate electrode 165 and the contact structure 180 may be formed on the interlayer insulating layer 190.

By disposing a metal-semiconductor layer to fill in a recess region of a source/drain region to reduce the resistance of a contact structure, a semiconductor device with improved electrical characteristics may be provided.

Figure 3:
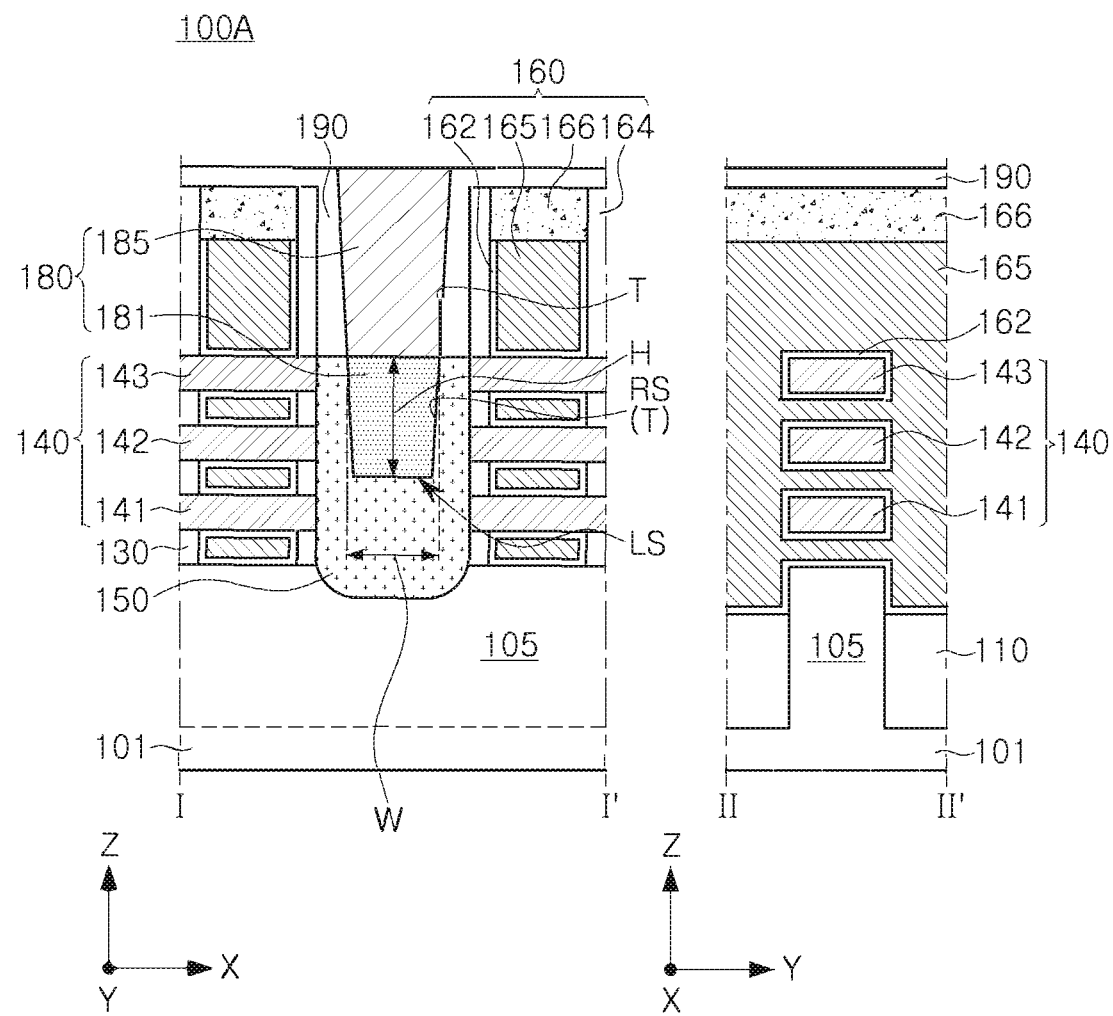
FIG. 3 is a cross-sectional view illustrating a semiconductor device according to example embodiments.

FIG. 3 is a cross-sectional view illustrating a semiconductor device according to example embodiments. FIG. 3 illustrates regions corresponding to cross-sections taken along lines I-I' and II-II' of FIG. 1.

Referring to FIG. 3, in a semiconductor device 100A, a barrier layer 185A may be omitted, and a contact structure 180 may include a metal-semiconductor layer 181 and a contact plug 185. The contact plug 185 may be disposed to fill a contact trench T. The contact plug 185 may include at least one of a metallic material, for example, aluminum (Al), copper (Cu), tungsten (W), cobalt (Co), ruthenium (Ru), or molybdenum (Mo). Since the semiconductor device 100A does not include the barrier layer 185A with relatively high resistance, the resistance of the contact structure 180 may be reduced, and electrical characteristics of the semiconductor device may be improved. A structure from which the barrier layer 185A is omitted may be equally applied to other embodiments described below.

Figure 4:
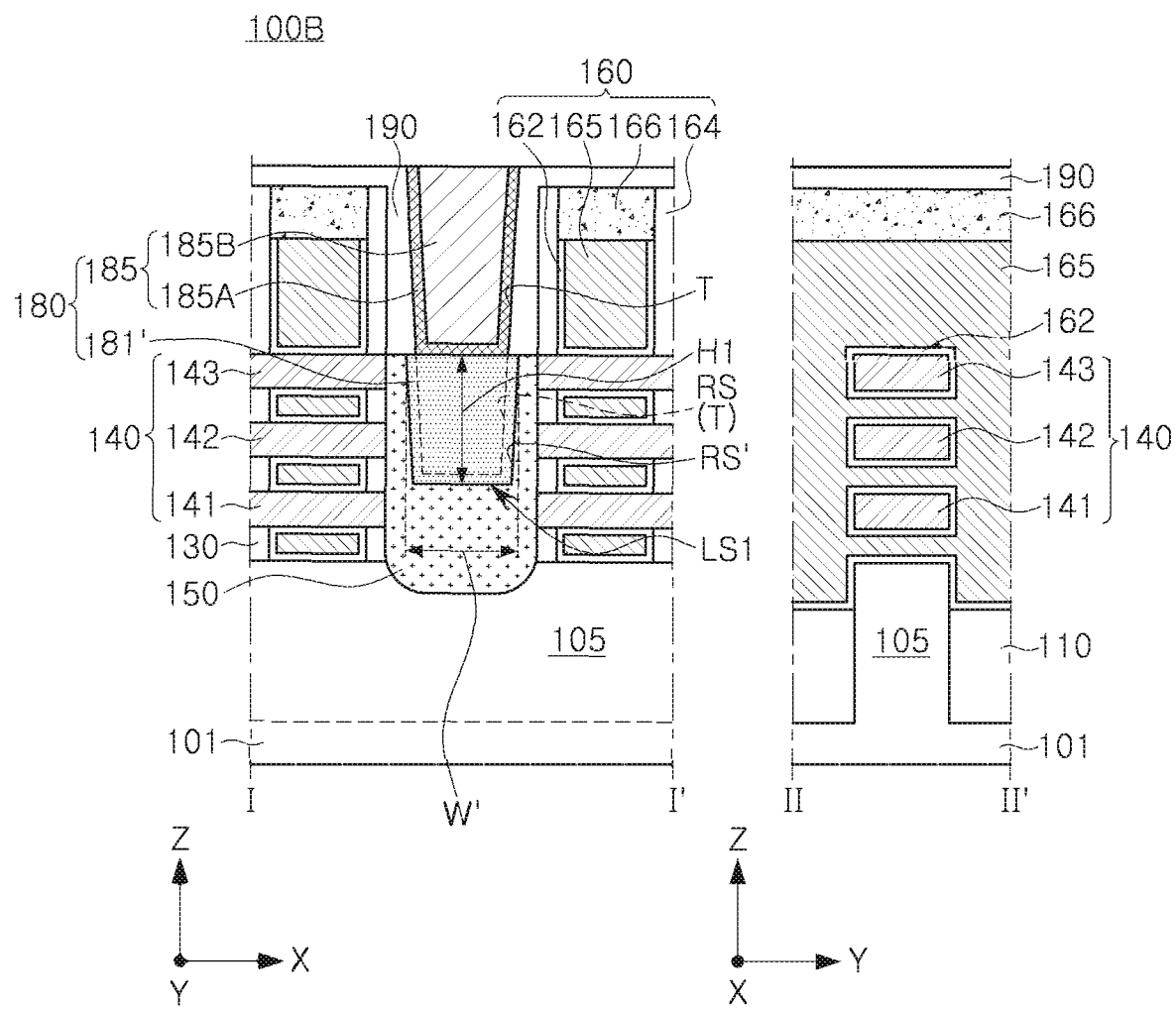
FIG. 4 is a cross-sectional view illustrating a semiconductor device according to example embodiments.

FIG. 4 is a cross-sectional view illustrating a semiconductor device according to example embodiments. FIG. 4 illustrates regions corresponding to cross-sections taken along lines I-I' and II-II' of FIG. 1.

Referring to FIG. 4, in a semiconductor device 100B, a portion of a metal-semiconductor layer 181' may be exposed from an initial recess region RS of a contact trench T extending into a source/drain region 150. A portion of a semiconductor material layer of the source/drain regions 150 may be silicided or germanided. In this embodiment, a boundary between the metal-semiconductor layer 181' and the source/drain regions 150 may be defined as a recess region RS'. A width W' of an upper surface of the metal-semiconductor layer 181' may be wider than a width of an upper portion of the initial recess region RS, and a vertical thickness H1 of the metal-semiconductor layer 181' may be greater than a depth of the initial recess region RS. A lower surface LS1 of the metal-semiconductor layer 181' may be located at a level lower than the lower surface LS of the embodiment of FIG. 2. In an example embodiment, the width W' of the upper surface of the metal-semiconductor layer 181' may be wider than a width of a lower surface of a contact plug 185.

Figure 5A:
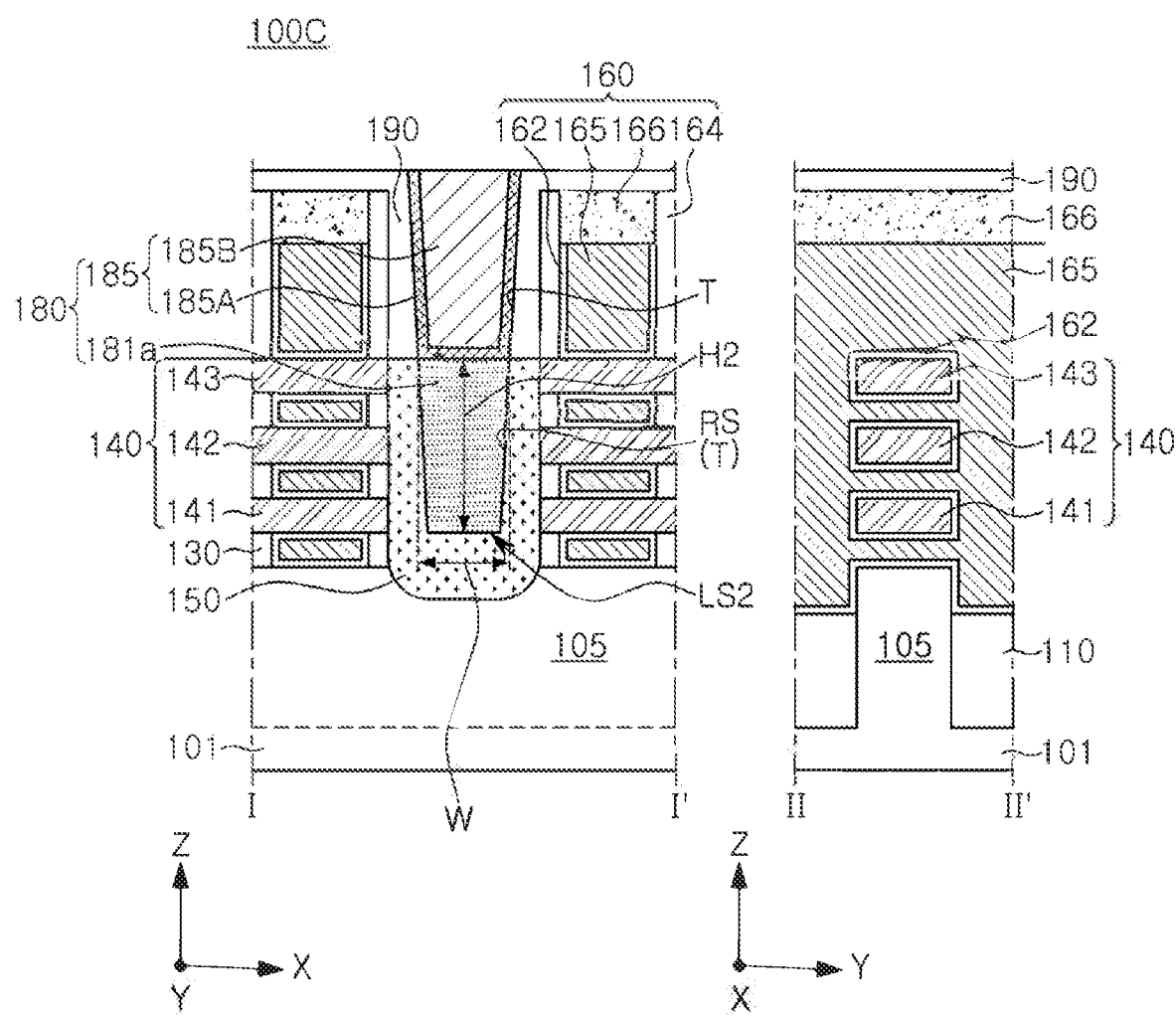
FIGS. 5A, 5B and 5C are cross-sectional views illustrating semiconductor devices according to example embodiments.

FIG. 5A is a cross-sectional view illustrating a semiconductor device according to example embodiments. FIG. 5A illustrates regions corresponding to cross-sections taken along lines I-I' and II-II' of FIG. 1.

Referring to FIG. 5A, in a semiconductor device 100C, a lower surface LS2 of a metal-semiconductor layer 181a may be located at a level, equal to or lower than a level of a lowermost first channel layer 141 among a plurality of channel layers 141, 142, and 143. A lower end of a recess region RS may be located at a predetermined depth H2 in a source/drain region 150, and correspondingly, the metal-semiconductor layer 181a may have a vertical thickness H2 in the Z direction. Therefore, the vertical thickness H2 may be greater than a vertical thickness of any one of the plurality of channel layers 141, 142, and 143, and may be, for example, about 10 nm or more, and may be in a range of about 10 nm to about 40 nm. Since a length of an electrical connection path between a contact structure 180 and a channel structure 140 may be shortened to lower resistance, electrical characteristics of the semiconductor device may be improved.

Figure 5B:
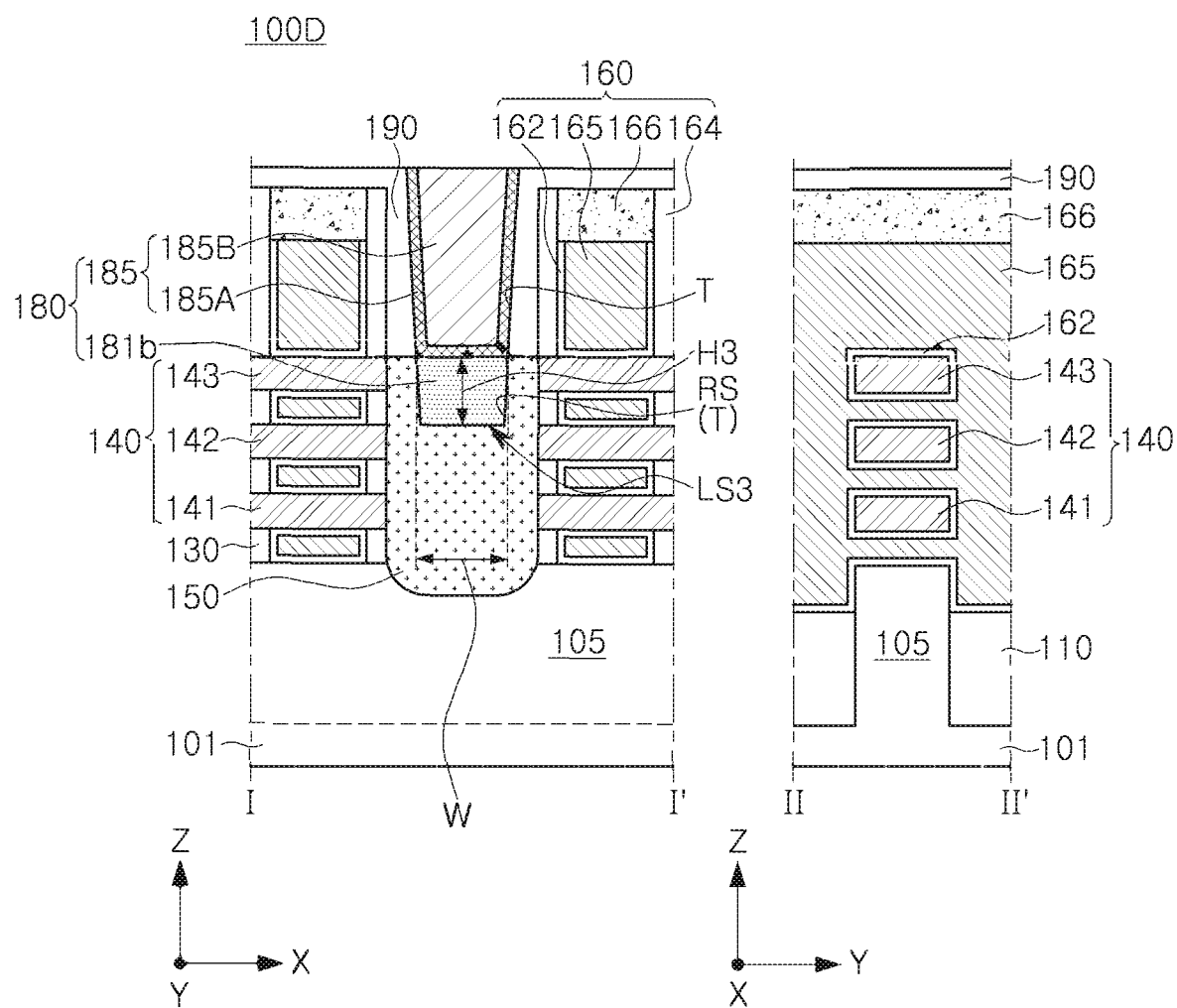

FIG. 5B is a cross-sectional view illustrating a semiconductor device according to example embodiments. FIG. 5B illustrates regions corresponding to cross-sections taken along lines I-I' and II-II' of FIG. 1.

Referring to FIG. 5B, in a semiconductor device 100D, a lower surface LS3 of a metal-semiconductor layer 181b may be located at a level lower of an uppermost third channel layer 143 among a plurality of channel layers 141, 142, and 143, and may be located at a level higher than a second channel layer 142. A lower end of a recess region RS may be located at a predetermined depth H3 within a source/drain region 150, and correspondingly, the metal-semiconductor layer 181b may have a vertical thickness H3 in the Z direction. Therefore, the vertical thickness H3 may be greater than a vertical thickness of any one of the plurality of channel layers 141, 142, and 143, for example, about 10 nm or more, and may be in a range of about 10 nm to about 40 nm. The vertical thickness H3 may be relatively smaller than the vertical thickness H of the embodiment of FIG. 2 and the vertical thickness H2 of the embodiment of FIG. 5A. In an example embodiment, even when a width W of an upper portion of the recess region RS is less than about 10 nm, the metal-semiconductor layer 181b may have a vertical thickness H3 of about 10 nm or more and may be disposed to fill the recess region RS. Therefore, a semiconductor device improving contact resistance to have improved electrical characteristics may be provided.

Figure 5C:
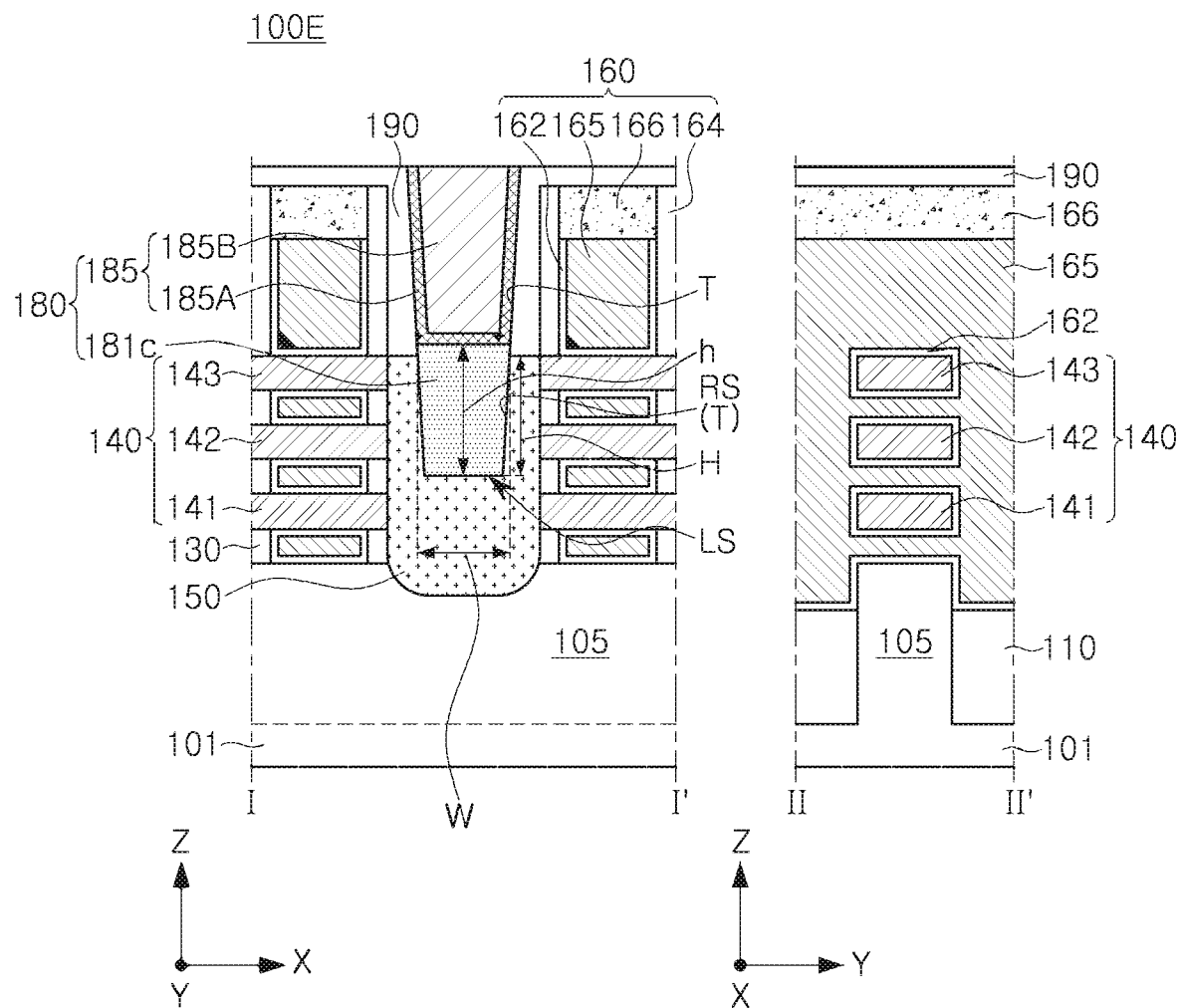

FIG. 5C is a cross-sectional view illustrating a semiconductor device according to example embodiments. FIG. 5C illustrates regions corresponding to cross-sections taken along lines I-I' and II-II' of FIG. 1.

Referring to FIG. 5C, in a semiconductor device 100E, an upper surface of a metal-semiconductor layer 181c may be located at a level higher than an upper surface of a source/drain region 150. The upper surface of the metal-semiconductor layer 181c may be located at a level higher than an upper surface of a third channel layer 143, an uppermost channel layer. A recess region RS may have a vertical depth H, and the metal-semiconductor layer 181c may fill the recess region RS and may protrude upwardly in the Z direction to have a vertical thickness h greater than a vertical depth H. In an example embodiment, the source/drain region 150 may also have a convex upper surface to protrude over the upper surface of the third channel layer 143, but is not limited thereto.

Figure 6:
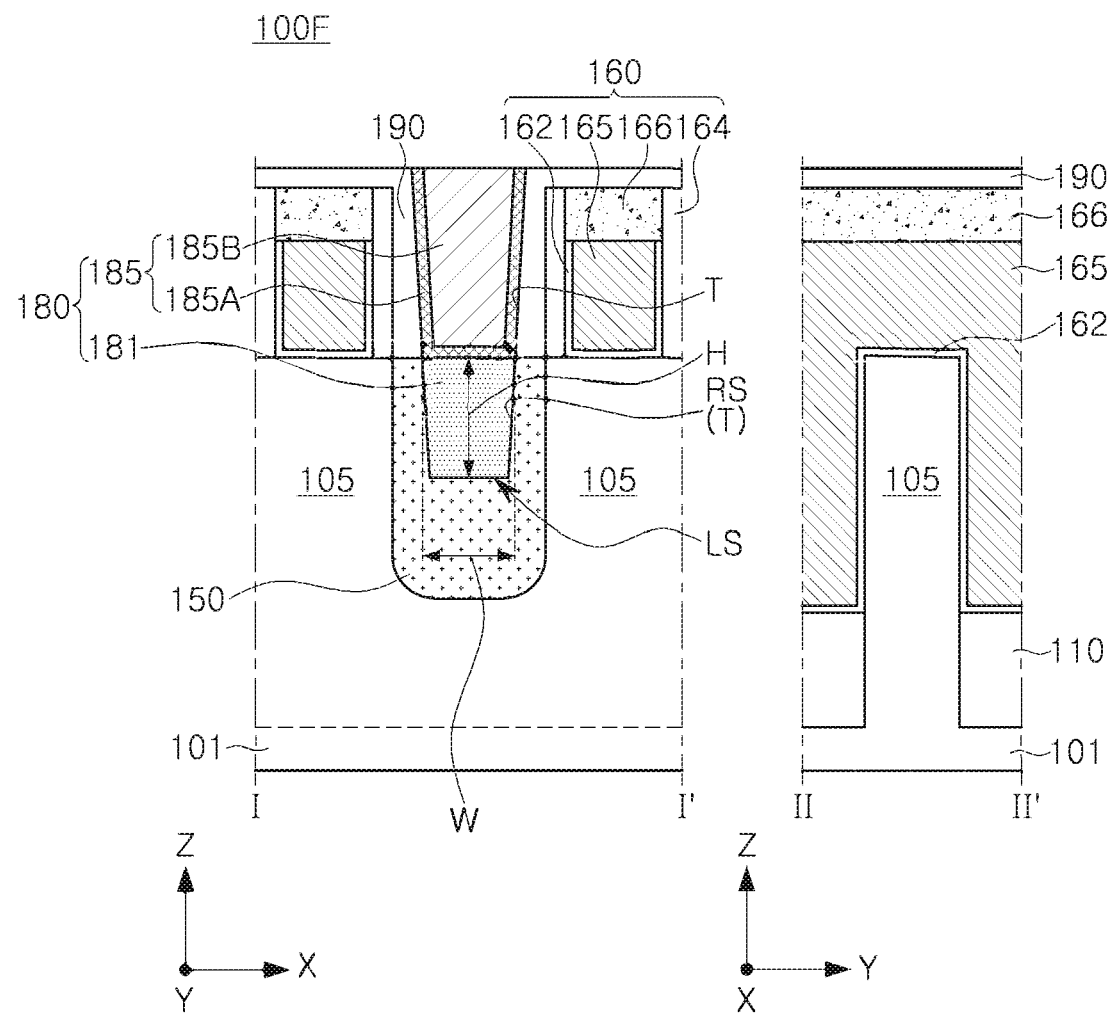
FIG. 6 is a cross-sectional view illustrating a semiconductor device according to example embodiments.

FIG. 6 is a cross-sectional view illustrating a semiconductor device according to example embodiments. FIG. 6 illustrates regions corresponding to cross-sections taken along lines I-I' and II-II' of FIG. 1.

Referring to FIG. 6, a semiconductor device 100F may include a FinFET in which a gate structure 160 surrounds three surfaces of an active region 105, for example, an upper surface and side surfaces of the active region 105 in the Y-direction. Unlike in the embodiment of FIG. 2, the semiconductor device 100F may not include a plurality of channel layers, and a channel region of a transistor may be formed in the active region 105 intersecting a gate electrode 165. Therefore, a portion of a contact trench T may extend into a source/drain region 150 to form a recess region RS, and a metal-semiconductor layer 181 may be disposed to fill the recess region RS.

Figure 7:
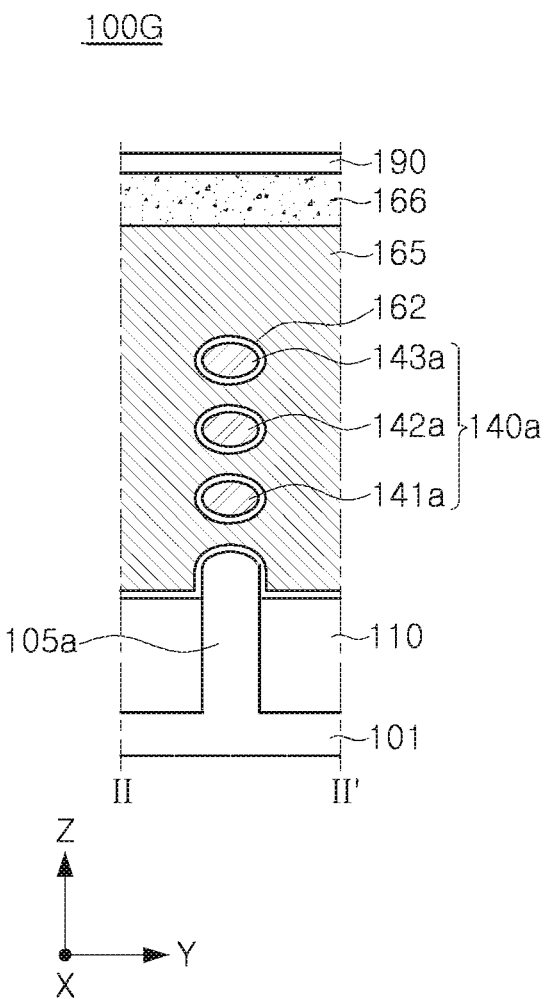
FIG. 7 is a cross-sectional view illustrating a semiconductor device according to example embodiments.

FIG. 7 is a cross-sectional view illustrating a semiconductor device according to example embodiments. FIG. 7 illustrates regions corresponding to cross-sections taken along lines I-I' and II-II' of FIG. 1.

Referring to FIG. 7, in a semiconductor device 100G, a width of an active region 105a and a width of a channel structure 140a may be different from those of the embodiment of FIG. 2. The active region 105a and the channel structure 140a may have a relatively small width, respectively, and accordingly, a plurality of channel layers 141a, 142a, and 143a of the channel structure 140a may have a circular shape or an elliptical shape with a small difference in length between a major axis and a minor axis, respectively. In embodiments, widths and shapes of the active region 105a and the channel structure 140a may be variously changed.

FIGS. 8 to 16 are views illustrating a process sequence illustrating a method of manufacturing a semiconductor device according to example embodiments. In FIGS. 8 to 16, an embodiment of a manufacturing method for manufacturing the semiconductor device of FIGS. 1 and 2 will be described.

Figure 8:
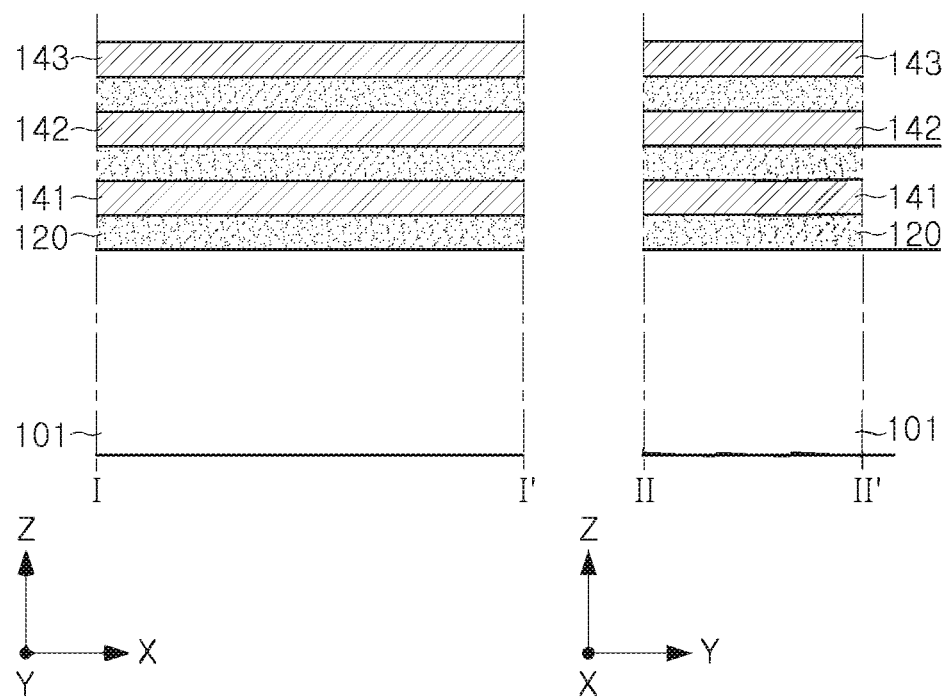
FIGS. 8 to 16 are views illustrating a process sequence illustrating a method of manufacturing a semiconductor device according to example embodiments.

Referring to FIG. 8, sacrificial layers 120 and channel layers 141, 142, and 143 may be alternately stacked on a substrate 101.

The sacrificial layers 120 may be layers to be replaced with the gate dielectric layer 162 and the gate electrode 165, as illustrated in FIG. 2, by a subsequent process. The sacrificial layers 120 may be formed between the substrate 101 and a first channel layer 141, between the first channel layer 141 and a second channel layer 142, and between the second channel layer 142 and a third channel layer 143. The sacrificial layers 120 may be formed of a material with etch selectivity with respect to the channel layers 141, 142, and 143. The channel layers 141, 142, and 143 may include a material different from the sacrificial layers 120. The sacrificial layers 120 and the channel layers 141, 142, and 143 may include, for example, a semiconductor material including at least one of silicon (Si), silicon germanium (SiGe), or germanium (Ge), but may include different materials, and may or may not include impurities. For example, the sacrificial layers 120 may include silicon germanium (SiGe), and the channel layers 141, 142, and 143 may include silicon (Si).

The sacrificial layers 120 and the channel layers 141, 142, and 143 may be formed by performing an epitaxial growth process using the substrate 101 as a seed. Each of the sacrificial layers 120 and the channel layers 141, 142, and 143 may be about 1 Å to 100 nm. The number of layers of the channel layers 141, 142, and 143 alternately stacked with the sacrificial layer 120 may be variously changed in embodiments.

Figure 9:
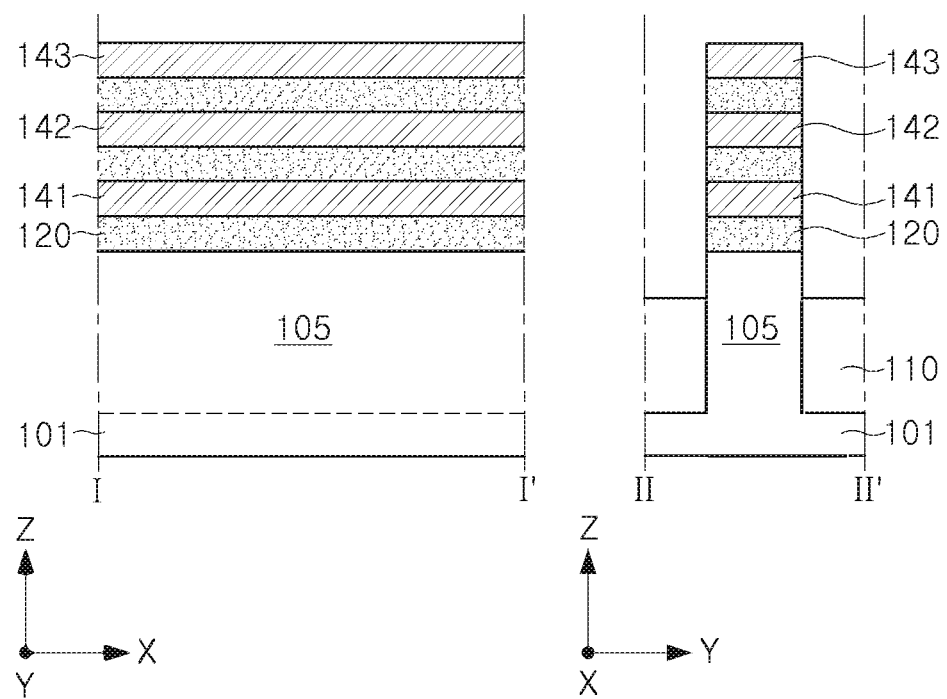

Referring to FIG. 9, a portion of a stacked structure of the sacrificial layers 120 and the channel layers 141, 142, and 143 and a portion of the substrate 101 may be removed to form active structures.

The active structures may include sacrificial layers 120 and channel layers 141, 142, and 143, alternately stacked with each other, and may further include an active region 105, formed by removing a portion of the substrate 101 to protrude from an upper surface of the substrate 101, respectively. The active structures may be formed to have a linear shape extending in one direction, for example, in the X-direction, and may be disposed to be spaced apart from each other in the Y-direction.

An insulating material may be filled and may be then recessed to protrude the active region 105, in a region from which a portion of the substrate 101 is removed, to form device isolation layers 110. Upper surfaces of the device isolation layers 110 may be formed to be lower than an upper surface of the active region 105.

Figure 10:
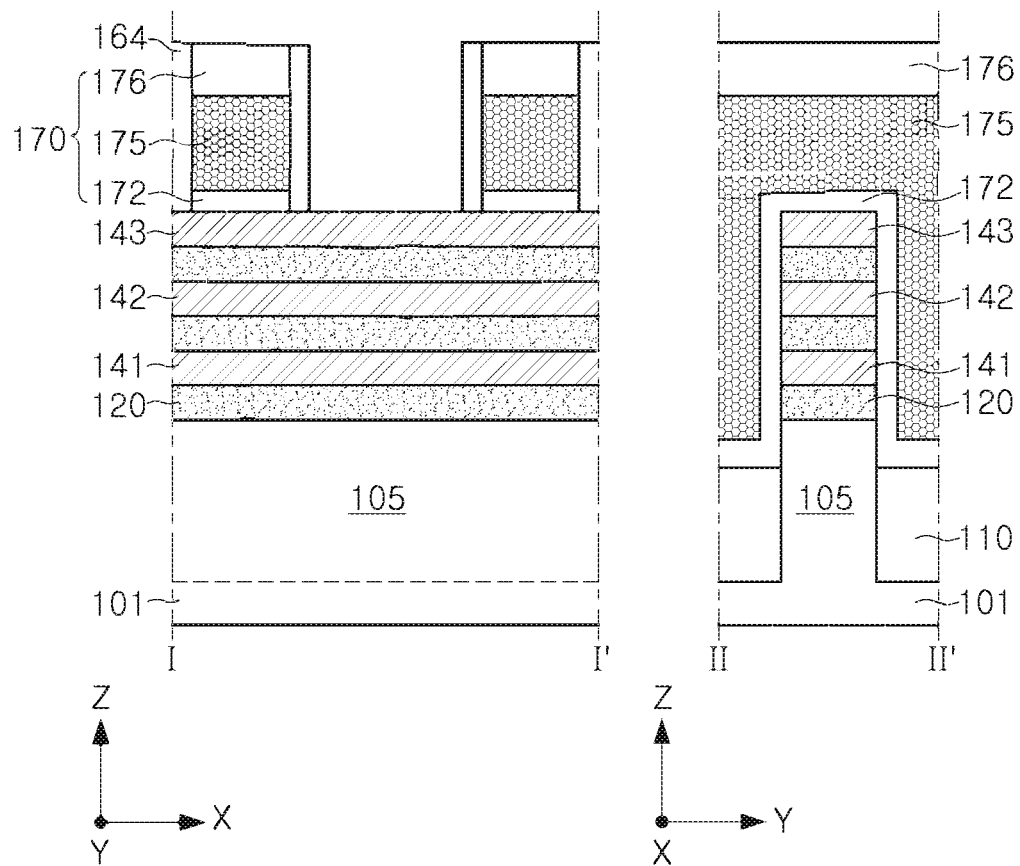

Referring to FIG. 10, sacrificial gate structures 170 and spacer layers 164 may be formed on the active structures.

The sacrificial gate structures 170 may be sacrificial structures formed in a region in which the gate dielectric layer 162 and the gate electrode 165 are arranged above the channel structures 140 by a subsequent process, as illustrated in FIG. 2. The sacrificial gate structure 170 may include first and second sacrificial gate layers 172 and 175 and a mask pattern layer 176, sequentially stacked. The first and second sacrificial gate layers 172 and 175 may be patterned using the mask pattern layer 176. The first and second sacrificial gate layers 172 and 175 may be an insulating layer and a conductive layer, respectively, but are not limited thereto, and the first and second sacrificial gate layers 172 and 175 may be formed as a single layer. For example, the first sacrificial gate layer 172 may include silicon oxide, and the second sacrificial gate layer 175 may include polysilicon. The mask pattern layer 176 may include silicon oxide and/or silicon nitride. The sacrificial gate structures 170 may have a linear shape extending in one direction intersecting the active structures. The sacrificial gate structures 170 may extend in the Y-direction, for example, and may be disposed to be spaced apart from each other in the X-direction.

The spacer layers 164 may be formed on both sidewalls of the sacrificial gate structures 170. The spacer layers 164 may be prepared by forming a film with a uniform thickness along upper and side surfaces of the sacrificial gate structures 170 and the active structures and performing then anisotropic etching. The spacer layers 164 may be formed of a low-k material and may include, for example, at least one of SiO, SiN, SiCN, SiOC, SiON, or SiOCN.

Figure 11:
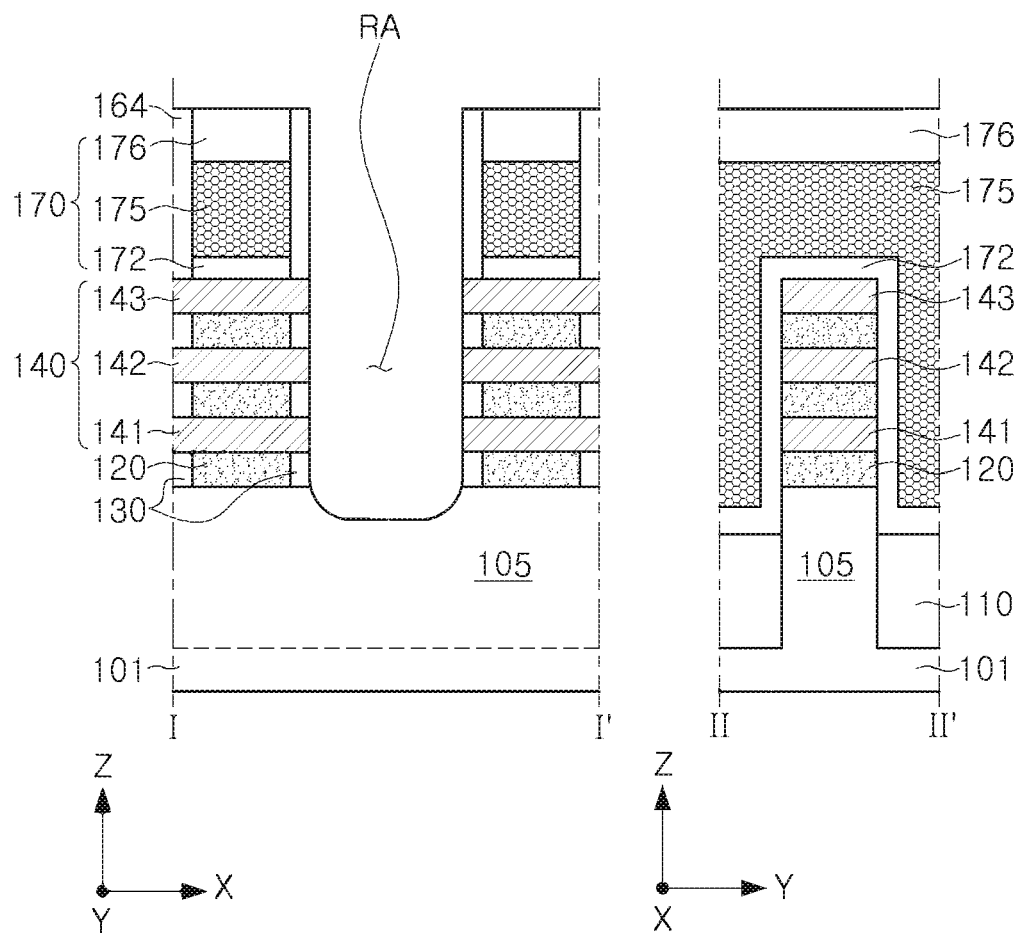

Referring to FIG. 11, portions of the sacrificial layers 120 and portions of the channel layers 141, 142, and 143, exposed between the sacrificial gate structures 170, may be removed to form a recess portion RA, thereby forming channel structures 140, and forming internal spacer layers 130.

First, exposed portions of the sacrificial layers 120 and exposed portions of the channel layers 141, 142, and 143 may be removed by using the sacrificial gate structures 170 and the spacer layers 164 as masks. As a result, the channel layers 141, 142, and 143 may have a limited length in the X-direction and may form a channel structure 140. In another example, below the sacrificial gate structures 170, side portions of the sacrificial layers 120 and side portions of the channel structure 140 may be partially removed, to locate both side surfaces thereof in the X-direction below the sacrificial gate structures 170 and the spacer layers 164.

Next, side portions of the sacrificial layers 120 exposed by a recess portion RA may be partially removed, and internal spacer layers 130 may be formed in the removed side portions of the sacrificial layers 120. Side portions of the sacrificial layers 120 may be selectively etched with respect to the channel structures 140 by, for example, a wet etching process, and may be partially removed in the X-direction.

The sacrificial layers 120 may have side surfaces that may be concave inwardly by the etching of the side portions as described above. Shapes of the side surfaces of the sacrificial layers 120 are not limited to those illustrated. The internal spacer layers 130 may be formed by filling an insulating material in a region in which the sacrificial layers 120 are partially removed, and removing a portion of the insulating material deposited outside the channel structures 140. The internal spacer layers 130 may be formed of materials, equal to those of the spacer layers 164, but are not limited thereto. For example, the internal spacer layers 130 may include at least one of SiN, SiCN, SiOCN, SiBCN, or SiBN. However, according to embodiments, an operation of forming the internal spacer layers 130 may be omitted.

Figure 12:
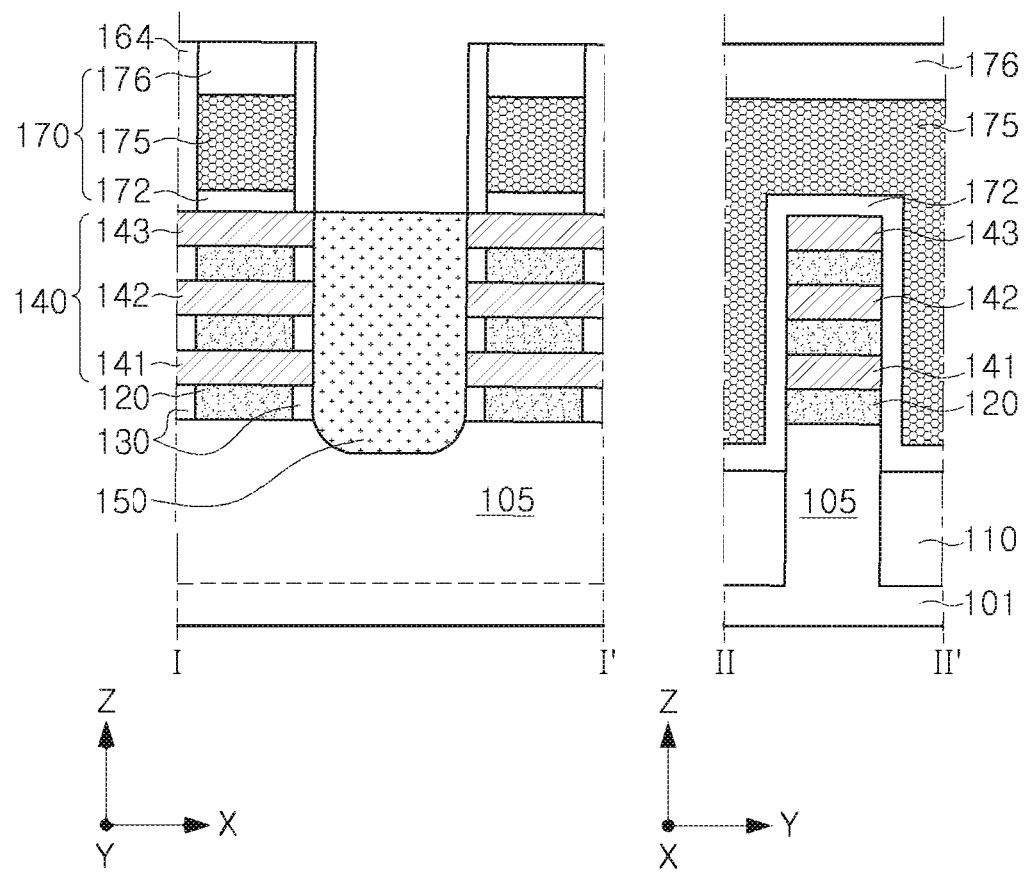

Referring to FIG. 12, source/drain regions 150 may be formed on the active region 105 on both sides of the sacrificial gate structures 170. The source/drain regions 150 may be formed by performing an epitaxial growth process in the recess portion RA. The source/drain regions 150 may be connected to the plurality of channel layers 141, 142, and 143 of the channel structures 140 through side surfaces thereof. Upper surfaces of the source/drain regions 150 may be disposed at a level, substantially equal to a level of the upper surface of the third channel layer 143, but are not limited thereto and may be disposed at a higher level than the level of the upper surface of the third channel layer 143. The source/drain regions 150 may include impurities by in-situ doping, and may include a plurality of layers with different doping elements and/or doping concentrations.

Figure 13:
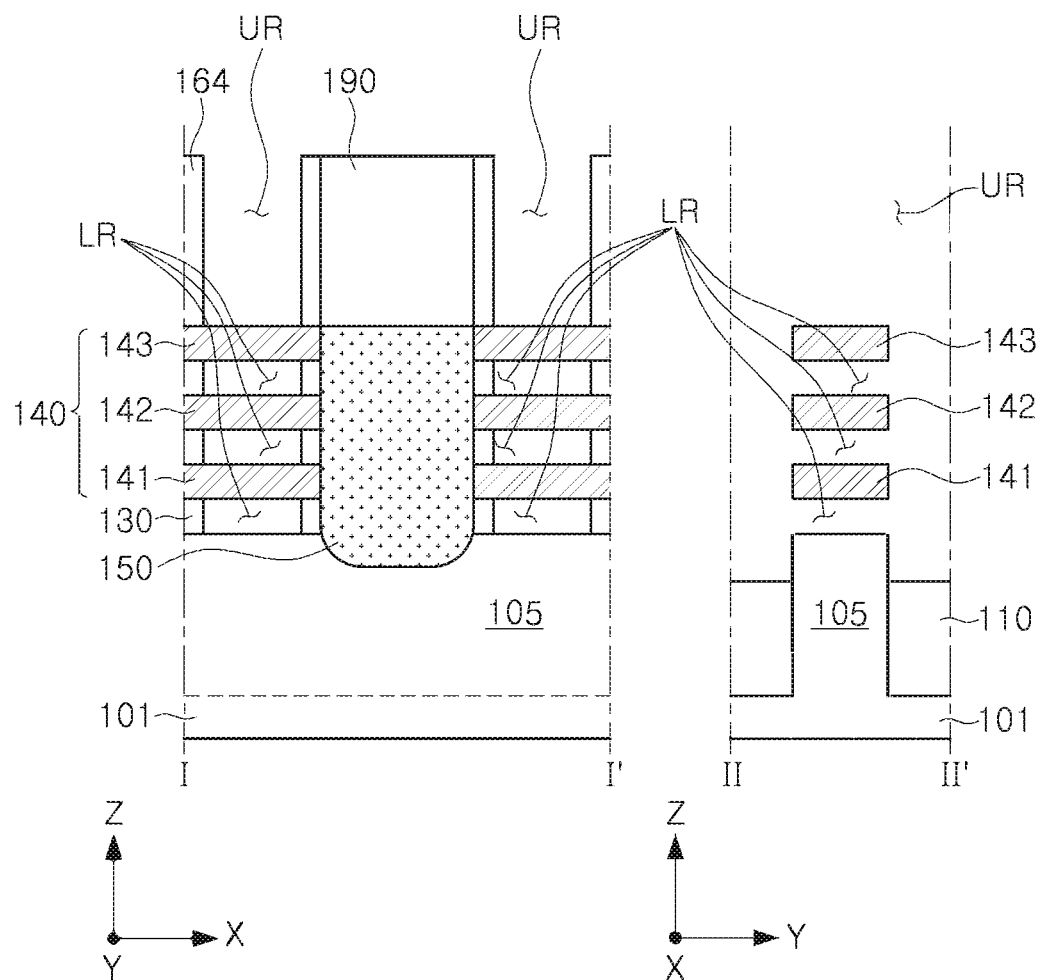

Referring to FIG. 13, an interlayer insulating layer 190 may be formed on the source/drain regions 150, and the sacrificial gate structures 170 and the sacrificial layers 120 may be removed.

The interlayer insulating layer 190 may be partially formed by forming an insulating film covering the sacrificial gate structures 170 and the source/drain regions 150 and performing a planarization process to expose the upper surface of the mask pattern layer 176.

The sacrificial gate structures 170 and the sacrificial layers 120 may be selectively removed with respect to the spacer layers 164, the interlayer insulating layer 190, and the channel structures 140. First, the sacrificial gate structures 170 may be removed to form upper gap regions UR, and then the sacrificial layers 120 exposed through the upper gap regions UR may be removed to form lower gap regions LR. For example, when the sacrificial layers 120 include silicon germanium (SiGe) and the channel structures 140 include silicon (Si), the sacrificial layers 120 may be selectively removed by performing a wet etching process using peracetic acid as an etchant.

Figure 14:
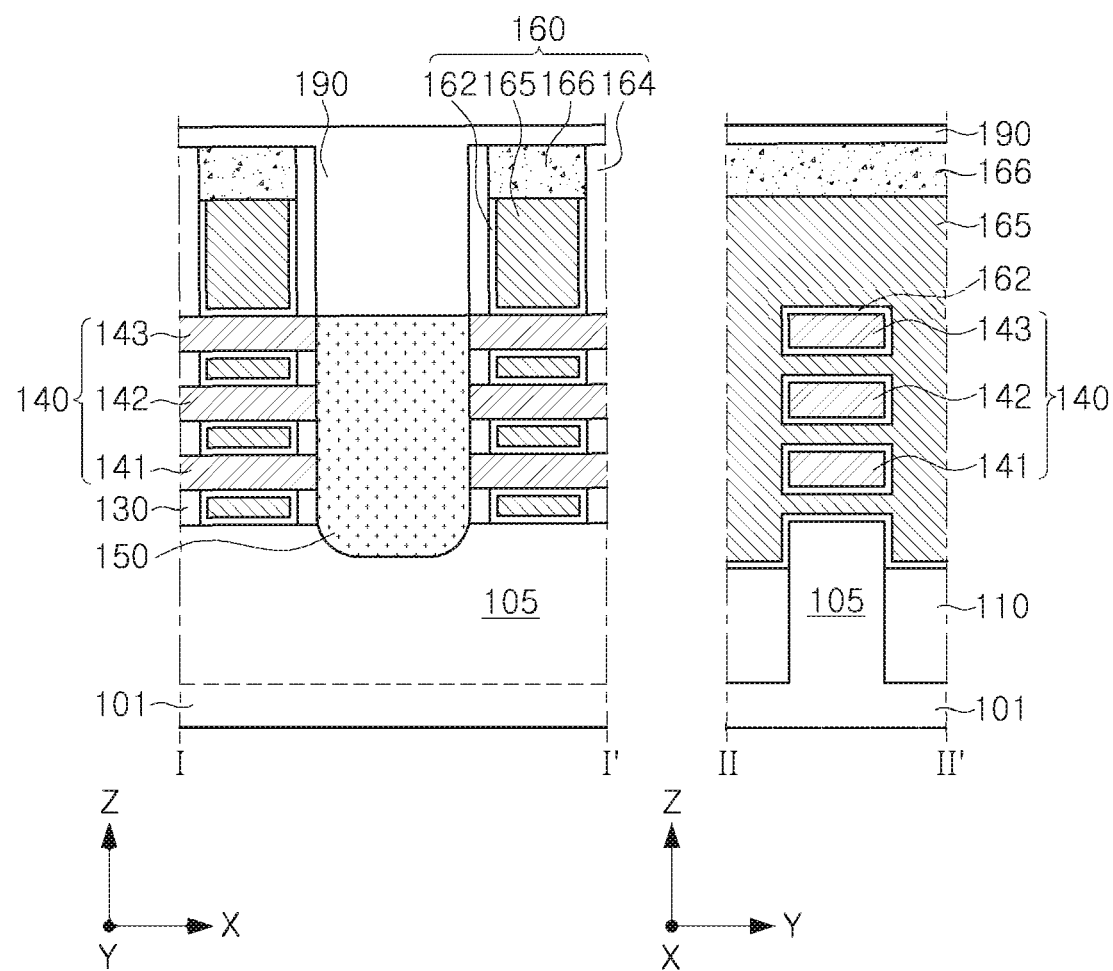

Referring to FIG. 14, a gate dielectric layer 162 and a gate electrode 165 may be formed in the upper gap regions UR and the lower gap regions LR.

The gate dielectric layers 162 may be formed to conformally cover inner surfaces of the upper gap regions UR and the lower gap regions LR. After forming the gate electrodes 165 to fill the upper and lower gap regions UR and LR, the gate electrodes 165 may be removed from upper portions thereof to a predetermined depth in the upper gap regions UR. A gate capping layer 166 may be formed in regions in which the gate electrodes 165 are removed from the upper gap regions UR. Therefore, gate structures 160 with the gate dielectric layer 162, the gate electrode 165, the spacer layers 164, and the gate capping layer 166 may be formed. Thereafter, an interlayer insulating layer 190 may be additionally formed.

Figure 15:
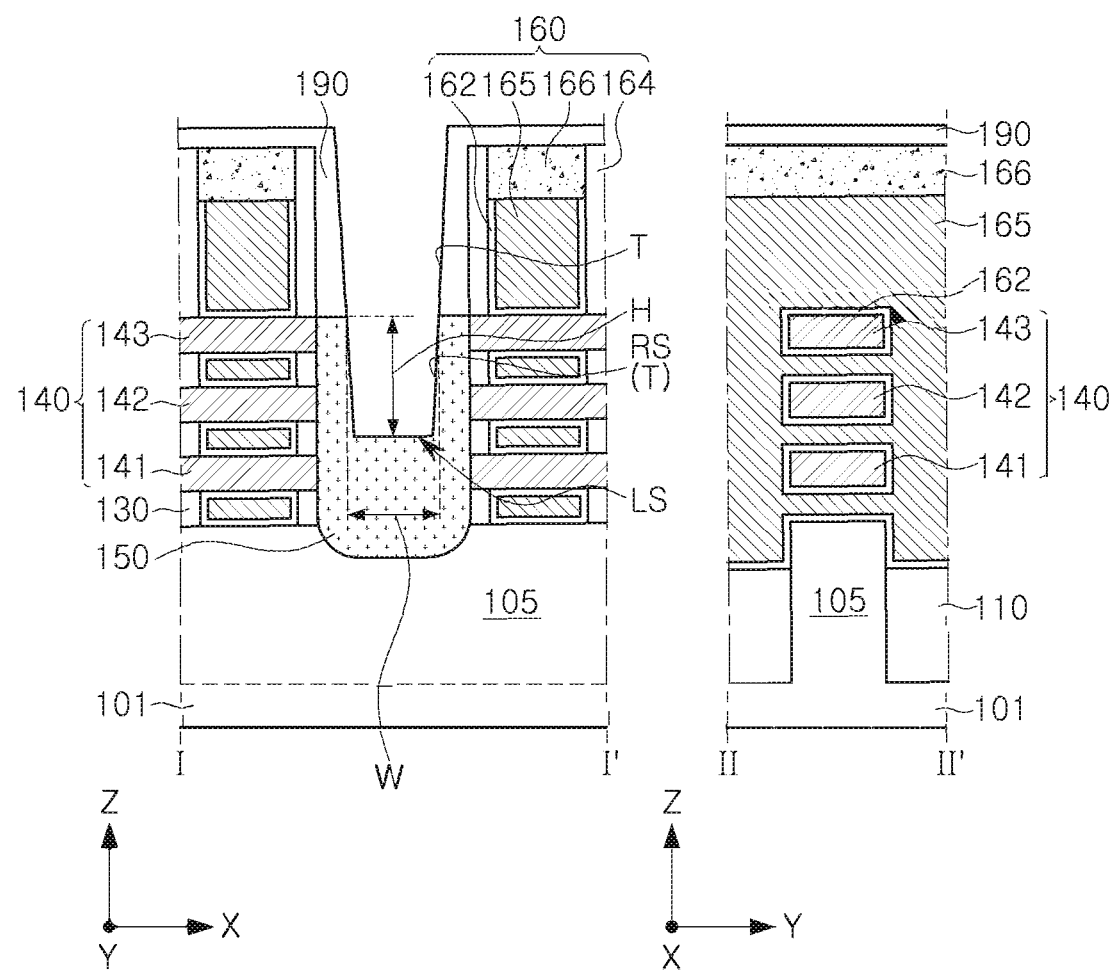

Referring to FIG. 15, a contact trench T passing through the interlayer insulating layer 190 may be formed between the gate structures 160.

The interlayer insulating layer 190 may be patterned to form a contact trench T. The contact trench T may partially extend into the source/drain regions 150 to form a recess region RS in the source/drain regions 150. The recess region RS may be recessed from an upper portion of the source/drain region 150 to a predetermined depth H in a downward direction. The recess region RS may be formed to have a predetermined width W in an upper portion of the recess region RS. In an example embodiment, the contact trench T may be formed to partially expose outer side surfaces of the spacer layers 164.

Figure 16:
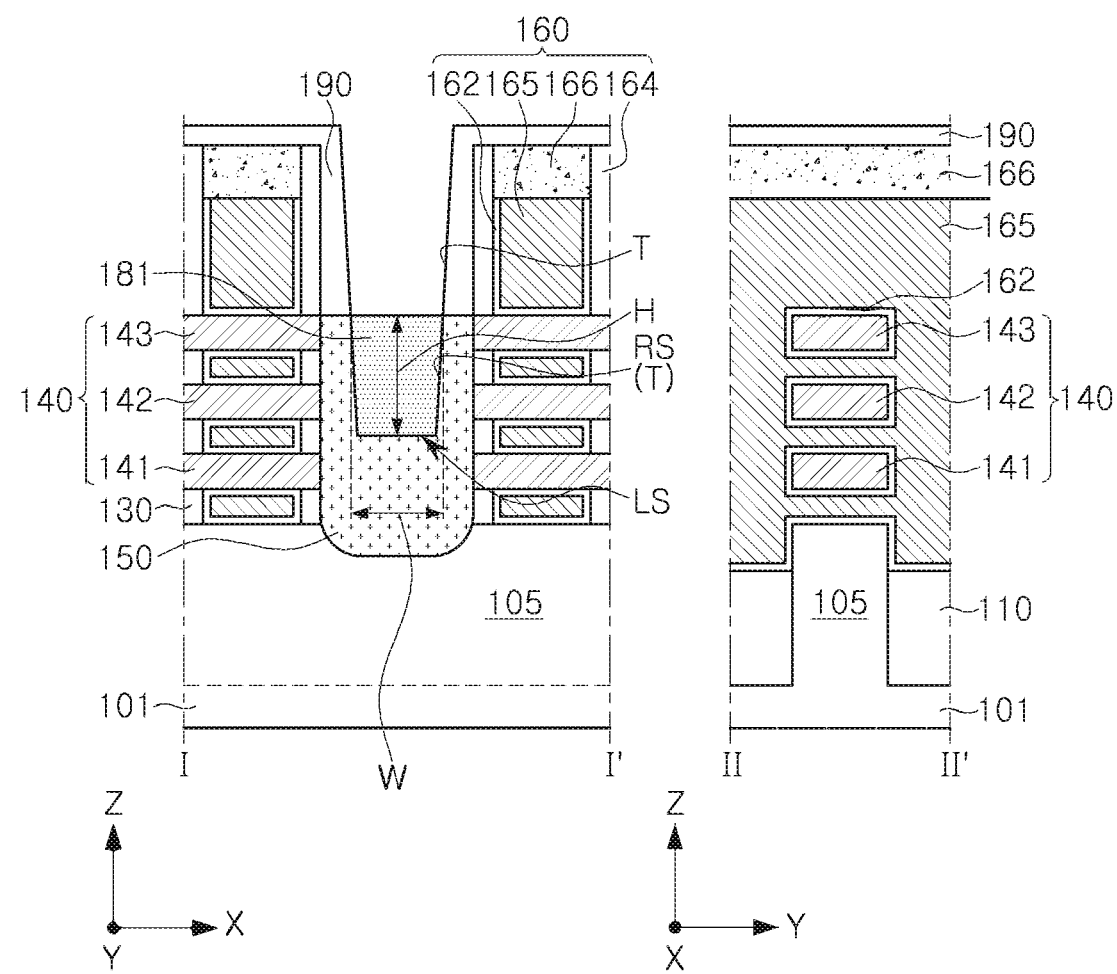

Referring to FIG. 16, a metal-semiconductor layer 181 may be formed to fill the recess region RS.

The metal-semiconductor layer 181 may be formed by selectively depositing a metal-semiconductor compound to fill the recess region RS of the source/drain region 150. The metal-semiconductor compound may be formed to cover the bottom and side surfaces of the recess region RS. In an example embodiment, the metal-semiconductor layer 181 may be formed to further protrude over the upper surfaces of the source/drain regions 150 upwardly. In an example embodiment, the metal-semiconductor layer 181 may include a portion in which a semiconductor material of the source/drain regions 150 is partially silicided or germanided.

It may be difficult to form the metal-semiconductor layer 181 to fill the recess region RS with a relatively deep depth H and a narrow width W by physical vapor deposition (PVD) (e.g., it may be difficult to form the metal-semiconductor layer 181 to fill the recess region RS in order to contact a barrier layer 185A of a contact plug 185 and the source/drain regions 150, to increase resistance).

In using chemical vapor deposition (CVD), the metal-semiconductor layer 181 may be formed to conformally cover an inner wall of the recess region RS, but a metal material such as titanium (Ti) may be deposited on an inner wall of the interlayer insulating layer 190 in the contact trench T to increase a ratio occupied by a conductive layer 185B of the contact plug 185, to increase resistance. The metal material such as titanium (Ti) may be selectively formed to have a thin thickness in the recess region RS. Since some consumption of the semiconductor material in the source/drain region 150 may be used by a subsequent process, there may be a limit to forming the metal-semiconductor layer 181 to be thick. Additionally, or alternatively, when the metal-semiconductor layer 181 is formed in a "U" shape or a similar shape, a ratio of the barrier layer 185A with high resistance in the contact structure 180 may increase to increase resistance.

According to an example embodiment of the present inventive concept, a metal-semiconductor compound, for example, titanium silicide (TiSi), forming a metal-semiconductor layer 181, may be selectively formed to fill a recess region RS to reduce a ratio occupied by a barrier layer 185A with high resistance in a contact structure 180, to lower contact resistance. Additionally, or alternatively, since the consumption of a semiconductor material in source/drain regions 150 may not be accompanied, the metal-semiconductor layer 181 may be formed to be thick in the recess region RS. Therefore, a semiconductor device with improved electrical characteristics may be provided.

Various advantages and effects of the present inventive concept are not limited to the above description, and may be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
an active region disposed on a substrate, the active region extending in a first direction;
a plurality of channel layers disposed on the active region, the plurality of channel layers spaced apart from each other along a second direction;
gate electrodes disposed on the substrate, the gate electrodes intersecting the active region and the plurality of channel layers, extending in a third direction, and surrounding the plurality of channel layers;
a source/drain region disposed on the active region on at least one side of the gate electrodes, the source/drain region contacting the plurality of channel layers; and
a contact structure disposed between the gate electrodes, the contact structure extending in the second direction and contacting the source/drain region,
wherein the source/drain region includes a recess region recessed from an upper portion of the source/drain region,
wherein the contact structure includes a metal-semiconductor layer disposed to fill the recess region and a contact plug disposed on the metal-semiconductor layer,
wherein a lower surface of the metal-semiconductor layer is located at a level lower than an uppermost channel layer among the plurality of channel layers, and
wherein an uppermost surface of the metal-semiconductor layer is located at a level lower than the contact plug.

2. The semiconductor device of claim 1, wherein a thickness of the metal-semiconductor layer in the second direction is greater than 10 nm or equal to 10 nm.

3. The semiconductor device of claim 1, wherein a ratio of a thickness of the metal-semiconductor layer in the second direction to a width of the metal-semiconductor layer in the first direction is about 0.7 or more and about 4 or less.

4. The semiconductor device of claim 1, wherein a width of an upper surface of the metal-semiconductor layer is equal to or smaller than a width of a lower surface of the contact plug.

5. The semiconductor device of claim 1, wherein the contact plug includes a conductive layer and a barrier layer, the barrier layer surrounding a lower surface of the conductive layer and side surfaces of the conductive layer.

6. The semiconductor device of claim 1, wherein the plurality of channel layers includes a first channel layer, a second channel layer, and a third channel layer sequentially stacked on the active region along the second direction,
wherein the uppermost channel layer in the second direction is the third channel layer.

7. The semiconductor device of claim 6, wherein the lower surface of the metal-semiconductor layer is located at a level lower than the second channel layer in the second direction.

8. The semiconductor device of claim 1, wherein a thickness of the metal-semiconductor layer in the second direction is greater than a width of the metal-semiconductor layer in the first direction.

9. The semiconductor device of claim 1, wherein a lower surface of the contact plug is located at a level equal to or higher than an upper surface of the uppermost channel layer.

10. The semiconductor device of claim 1, further comprising a gate dielectric layer disposed between the active region and the gate electrodes, the gate dielectric layer further disposed between the plurality of channel layers and the gate electrodes.

11. A semiconductor device comprising:
an active region disposed on a substrate, the active region extending in a first direction;
first to third channel layers disposed on the active region, the plurality of channel layers spaced apart from each other along a second direction;
a gate electrode, the gate electrode disposed between the active region and the first channel layer, disposed between the first to third channel layers, disposed on the third channel layer, and extending in a third direction;
a source/drain region disposed on the active region on at least one side of the gate electrode, the source/drain region contacting the first to third channel layers and including a recess region; and
a contact structure including a metal-semiconductor layer and a contact plug, the metal-semiconductor layer filling the recess region of the source/drain region and the contact plug disposed on the metal-semiconductor layer,
wherein a lower end of the recess region is located at a level lower than the third channel layer, and
wherein a thickness of the metal-semiconductor layer in the second direction is greater than a thickness of the third channel layer in the second direction, and
wherein the contact plug does not overlap the metal-semiconductor layer in the first direction.

12. The semiconductor device of claim 11, wherein the metal-semiconductor layer overlaps at least two channel layers of the first to third channel layers in a horizontal direction perpendicular to the second direction.

13. The semiconductor device of claim 11, wherein the metal-semiconductor layer is flat in the recess region.

14. The semiconductor device of claim 11, wherein the first to third channel layers include a second channel layer, wherein the lower end of the recess region is located at a level equal to or lower than the second channel layer in the second direction.

15. The semiconductor device of claim 11, wherein the contact plug does not overlap the source/drain region in a horizontal direction perpendicular to the second direction.

16. The semiconductor device of claim 11, further comprising internal spacer layers, the internal spacer layers disposed on sides of the gate electrode, between the first to third channel layers, and between the first channel layer and the active region.

17. A semiconductor device comprising:
an active region disposed on a substrate, the active region extending in a first direction;
a plurality of channel layers disposed on the active region, the plurality of channel layers spaced apart from each other along a second direction;
a gate electrode disposed on the substrate, the gate electrode intersecting the active region and the plurality of channel layers, extending in a third direction, and surrounding the plurality of channel layers;
a source/drain region disposed on the active region on at least one side of the gate electrode, the source/drain region including a recess region recessed from an upper portion of the source/drain region;
an interlayer insulating layer covering a portion of an upper surface of the source/drain region on at least one side of the gate electrode;
a metal-semiconductor layer disposed to fill the recess region of the source/drain region; and
a contact plug passing through the interlayer insulating layer,
wherein a lowermost surface of the contact plug is located in a plane above an uppermost surface of the metal-semiconductor layer,
wherein the uppermost surface of the metal-semiconductor layer is disposed at a level equal to or higher than an upper surface of an uppermost channel layer among the plurality of channel layers.

18. The semiconductor device of claim 17, wherein a depth of the recess region in the second direction is 10 nm or greater than 10 nm.

19. The semiconductor device of claim 17, wherein a depth of the recess region in the second direction is greater than a thickness of one of the plurality of channel layers in the second direction.

20. The semiconductor device of claim 17, wherein a ratio of a depth of the recess region in the second direction to a width of an upper portion of the recess region in the first direction is between 0.7 and 4.

* * * * *